(12) United States Patent
Tarui et al.

(10) Patent No.: US 8,680,538 B2
(45) Date of Patent: Mar. 25, 2014

(54) SILICON CARBIDE SEMICONDUCTOR DEVICE

(75) Inventors: Yoichiro Tarui, Tokyo (JP); Kenichi Ohtsuka, Tokyo (JP); Naruhisa Miura, Tokyo (JP); Yoshinori Matsuno, Tokyo (JP); Masayuki Imaizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 587 days.

(21) Appl. No.: 12/867,061

(22) PCT Filed: Feb. 12, 2008

(86) PCT No.: PCT/JP2008/052230
§ 371 (c)(1),
(2), (4) Date: Aug. 11, 2010

(87) PCT Pub. No.: WO2009/101668
PCT Pub. Date: Aug. 20, 2009

(65) Prior Publication Data
US 2010/0314629 A1    Dec. 16, 2010

(51) Int. Cl.
*H01L 29/15*    (2006.01)

(52) U.S. Cl.
USPC ....... 257/77; 257/135; 257/262; 257/E29.104

(58) Field of Classification Search
USPC .............................. 257/77, 135, 262, E29.104
See application file for complete search history.

(56) References Cited

U.S. PATENT DOCUMENTS

| 2005/0158979 | A1 | 7/2005 | Momota et al. |
| 2006/0065899 | A1* | 3/2006 | Hatakeyama et al. ........... 257/77 |
| 2007/0090370 | A1* | 4/2007 | Nakayama et al. ............. 257/77 |
| 2007/0170436 | A1* | 7/2007 | Sugawara ....................... 257/77 |

FOREIGN PATENT DOCUMENTS

| JP | 2003 282888 | 10/2003 |
| JP | 2004 363518 | 12/2004 |
| JP | 2006 100593 | 4/2006 |
| JP | 2006 196652 | 7/2006 |
| JP | 2007 103524 | 4/2007 |

OTHER PUBLICATIONS

U.S. Appl. No. 13/252,565, filed Oct. 4, 2011, Tarui, et al.
Chinese Office Action issued Dec. 1, 2011 in patent application No. 200880126600.5 with English translation.

(Continued)

*Primary Examiner* — Howard Weiss
*Assistant Examiner* — Tifney Skyles
(74) *Attorney, Agent, or Firm* — Oblon, Spivak, McClelland, Maier & Neustadt, L.L.P.

(57) ABSTRACT

In order to obtain a silicon carbide semiconductor device that ensures both stability of withstand voltage and reliability in high-temperature operations in its termination end-portion provided for electric-field relaxation in the perimeter of a cell portion driven as a semiconductor element, the termination end-portion is provided with an inorganic protection film having high heat resistance that is formed on an exposed surface of a well region as a first region formed on a side of the cell portion, and an organic protection film having a high electrical insulation capability with a little influence by electric charges that is formed on a surface of an electric-field relaxation region formed in contact relation to an outer lateral surface of the well region and apart from the cell portion, and on an exposed surface of the silicon carbide layer.

8 Claims, 26 Drawing Sheets

(56) References Cited

OTHER PUBLICATIONS

Korean Office Action issued Jan. 13, 2012 in patent application No. 10-2010-7017807 with English translation.

Rupp, R. et al., "2$^{nd}$ Generation" Sic Schottky Diodes: A New Benchmark in SiCDevice Ruggedness, Proceedings of the 18$^{th}$ International Symposium on Power Semiconductor Devices and IC's, Total Pages 4 (Jun. 4-8, 2006).

* cited by examiner

SILICON CARBIDE SEMICONDUCTOR DEVICE

TECHNICAL FIELD

The present invention relates to a silicon carbide semiconductor device, in particular to the silicon carbide semiconductor device having a termination structure for electric-field relaxation.

BACKGROUND ART

Silicon carbide (SiC) has a high electric field property to dielectric breakdown, and a wide band gap in comparison with silicon (Si). For this reason, a semiconductor device using silicon carbide (hereinafter, referred to as a "silicon carbide semiconductor device") has a feature of low resistance and the capability to operate at high temperatures in comparison with a semiconductor device using silicon, and thus expected as a next-generation power semiconductor device.

There is, for example, a MOSFET, a Schottky diode or a like element as such a silicon carbide semiconductor device in which an electric field concentrates in its termination end-portion provided in a perimeter of the element. When the electric field concentrates in the termination end-portion as described here, a voltage-withstand characteristic of the silicon carbide semiconductor device is lowered. For this reason, in order to relax the electric field concentration in the termination end-portion, to obtain sufficient capabilities of the silicon carbide semiconductor device, an electric-field relaxation structure such as a JTE (junction termination extension) or MFGR (multiple floating guard ring) structure is provided in the termination end-portion.

In addition, in order to secure reliability of the silicon carbide semiconductor device over a long period of time by stabilizing the characteristic thereof, a protection film is formed to constitute the top side of the termination end-portion having the electric-field relaxation structure such as a JTE or an MFGR.

As for such a protection film, it is generally taking place to use an oxide film, for example, as disclosed in Patent Documents 1 through 3.

In addition, the protection film using a polyimide film is disclosed in Non-Patent Document 1.

[Patent Document 1]
Japanese Laid-Open Patent Publication No. 2003-282888
[Patent Document 2]
Japanese Laid-Open Patent Publication No. 2007-103524
[Patent Document 3]
Japanese Laid-Open Patent Publication No. 2004-363518
[Non-Patent Document 1]
"2nd Generation" SiC Schottky diodes: A new benchmark in SiC device ruggedness, Proceedings of the 18th International Symposium on Power Semiconductor Devices and IC's, Jun. 4-8, 2006, Naples, Italy

DISCLOSURE OF THE INVENTION

Problems to be Solved by the Invention

However, when an oxide film is used as a protection film in a termination end-portion as disclosed in Patent Documents 1 through 3, electric charges at the interface between an oxide film and silicon carbide, or in the oxide film exert influence on stability of a withstand voltage of a silicon carbide semiconductor device. For example, depending on a formation method of an oxide film, electric charges at the interface between an oxide film and silicon carbide, or in the oxide film, very largely, and as a result, the withstand voltage of the silicon carbide semiconductor device varies.

In addition, when a polyimide film is used as a protection film of a termination end-portion as disclosed in Non-Patent Document 1, electric charges at the interface between an oxide film and silicon carbide, or in the oxide film do not exert the influence like the case of the oxide film; on the contrary, there arises a problem of thermal stability. For example, when a large current, observed as a surge current or the like, flows through a silicon carbide semiconductor device, the silicon carbide semiconductor device temporarily becomes high temperature, so that a polyimide film of less heat resistance will be degraded. This results in exerting influence on reliability of the silicon carbide semiconductor device. In addition, there is a problem that, although operations are expected at high temperature for the silicon carbide semiconductor device, the operation temperature is limited due to the polyimide film.

The present invention has been directed at solving those problems described above, and an object of the invention is to obtain a silicon carbide semiconductor device that ensures both stability of withstand voltage and reliability in high-temperature operations in a termination end-portion.

Means for Solving the Problems

In a silicon carbide semiconductor device according to the present invention, the silicon carbide semiconductor device comprises a termination end-portion provided for relaxing electric field in a perimeter of a cell-portion driven as a semiconductor element, wherein the termination end-portion comprises, a first region of a second conductivity type formed extending from a side of the cell portion, placed in a top side of a silicon carbide layer of a first conductivity type, and exposed on a surface of the silicon carbide layer; an electric-field relaxation region of the second conductivity type whose impurity concentration is relatively lower than that of the first region; and a silicon carbide layer; and wherein an inorganic protection film is formed on an exposed surface of the first region; and an organic protection film is formed at least on an exposed surface of the electric-field relaxation region and on an exposed surface portion of the

Effects of the Invention

In the silicon carbide semiconductor device according to the present invention, the termination end-portion provided for relaxing the electric field is provided with an inorganic protection film that is formed on an exposed surface of the first region, and an organic protection film that is formed on an exposed surface of the electric-field relaxation region and on an exposed surface portion of the silicon carbide layer, so that a silicon carbide semiconductor device can be attained that ensures both stability of withstand voltage and reliability in high-temperature operations in the termination end-portion.

EXPLANATION OF NUMERALS AND SYMBOLS

"1" designates an $n^+$-type (first conductivity type) semiconductor substrate;
"2," $n^-$-type (first conductivity type) silicon carbide layer (drift layer);
"3," p-type (second conductivity type) well region (first region);
"4," electric-field relaxation region of $p^-$-type (second conductivity type);
"5," n-type (first conductivity type) source region;
"6," $p^+$-type (second conductivity type) contact region;
"7," $n^+$-type (first conductivity type) channel stopper region (second region);
"8," inorganic protection film;
"8A," thermal oxide film;
"8B," first insulation film;
"8C," second insulation film;
"9," gate oxide film;
"10," gate electrode;
"11," interlayer insulation film;
"12," source electrode (first main electrode);
"13," organic protection film;
"14," drain electrode (second main electrode);
"15," oxide film;
"16," insulation film;
"17," oxide film;
"18," insulation film;
"20," $n^+$-type (first conductivity type) silicon carbide substrate;
"21," $n^-$-type (first conductivity type) silicon carbide layer;
"22," $p^+$-type (second conductivity type) silicon carbide substrate;
"23," $p^-$-type (second conductivity type) silicon carbide layer;
"24," oxide film;
"25," thermal oxide film;
"26," electrode pad;
"27," electrode pad;
"31," p-type (second conductivity type) guard-ring region (first region);
"31A," $p^+$-type (second conductivity type) guard-ring region;
"31B," p-type (second conductivity type) guard-ring region;
"31C," $p^+$-type (second conductivity type) guard-ring region;
"31D," p-type (second conductivity type) guard-ring region;
"31E," $p^-$-type (second conductivity type) guard-ring region;
"31F," p-type (second conductivity type) guard-ring region;
"31G," $p^-$-type (second conductivity type) guard-ring region;
"31H," $p^+$-type (second conductivity type) guard-ring region;
"31J," p-type (second conductivity type) guard-ring region;
"32," Schottky electrode (first main electrode);
"33," cathode electrode (second main electrode);
"41," anode electrode (first main electrode);
"42," p-type (second conductivity type) well region (first region);
"X," termination end-portion; and
"Y," cell portion.

BEST MODE FOR CARRYING OUT THE INVENTION

Embodiment 1

Figure 1:
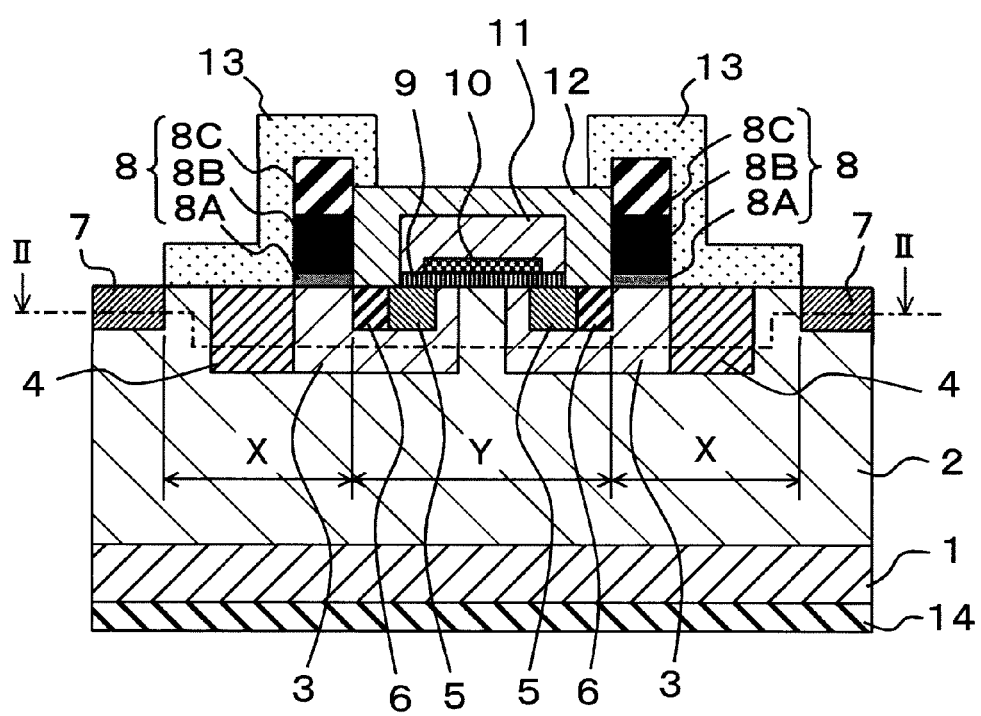
FIG. 1 is a longitudinal section diagram illustrating a structure of a silicon carbide semiconductor device (power MOSFET) according to Embodiment 1 of the present invention.
Figure 2:
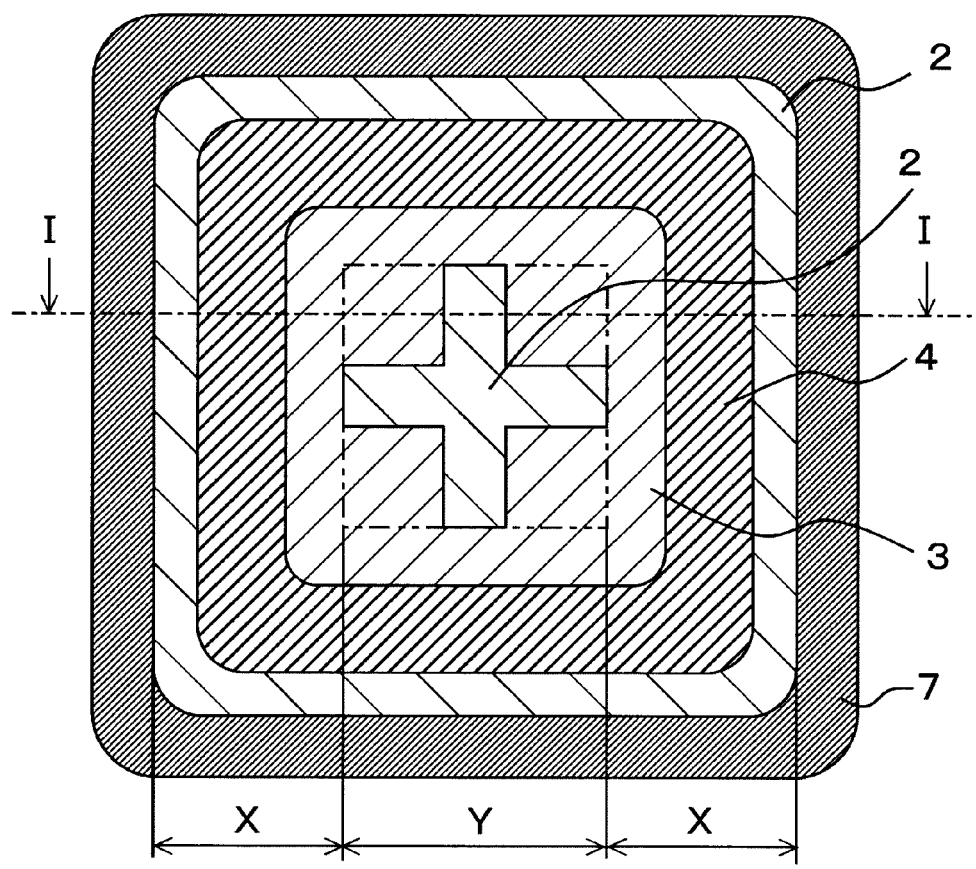
FIG. 2 is a lateral section diagram illustrating a structure of the silicon carbide semiconductor device (power MOSFET) according to Embodiment 1 of the present invention.
Figure 3:
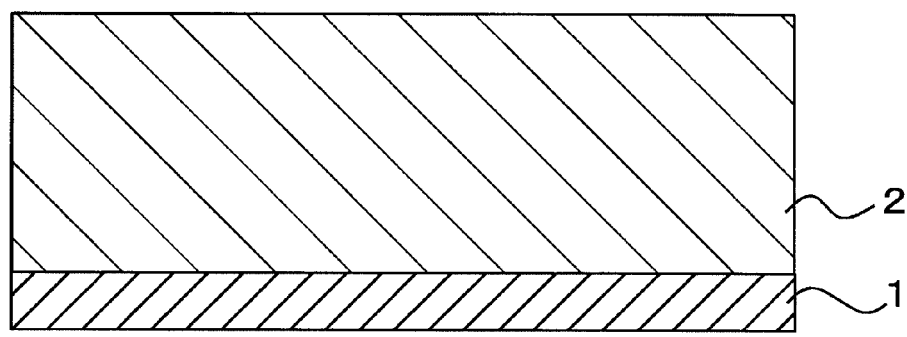
FIG. 3 is an illustrative diagram for explaining a manufacturing process of the silicon carbide semiconductor device (power MOSFET) according to Embodiment 1 of the present invention.
Figure 4:
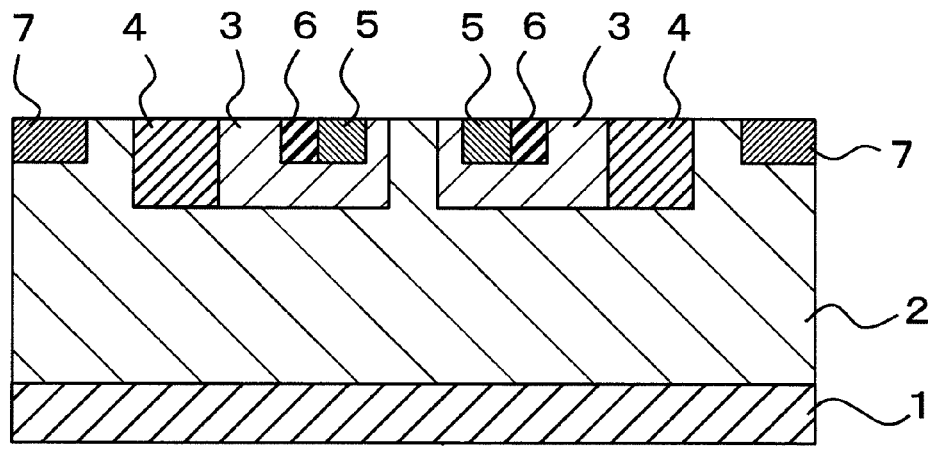
FIG. 4 is an illustrative diagram for explaining a manufacturing process of the silicon carbide semiconductor device (power MOSFET) according to Embodiment 1 of the present invention.
Figure 5:
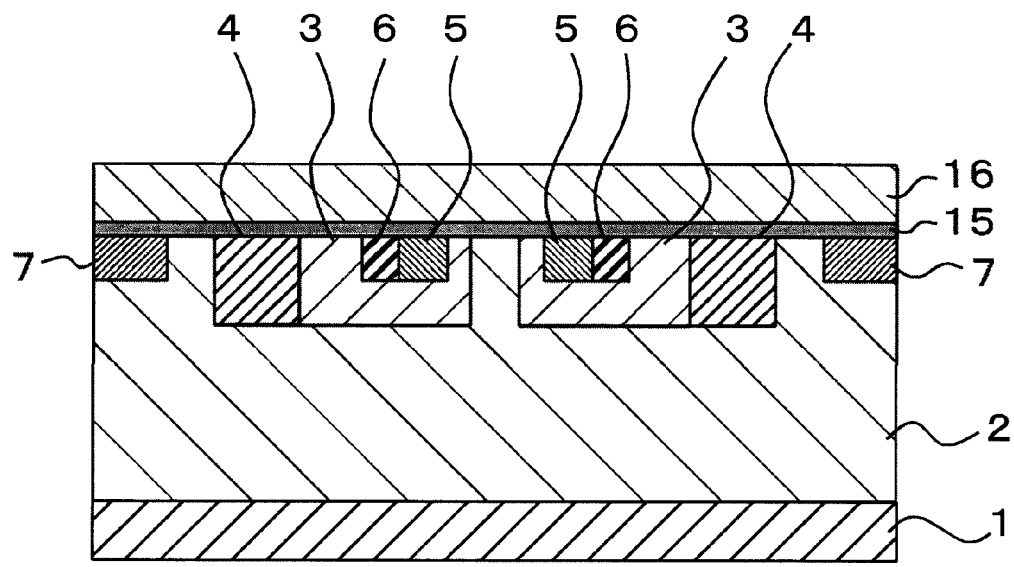
FIG. 5 is an illustrative diagram for explaining a manufacturing process of the silicon carbide semiconductor device (power MOSFET) according to Embodiment 1 of the present invention.
Figure 6:
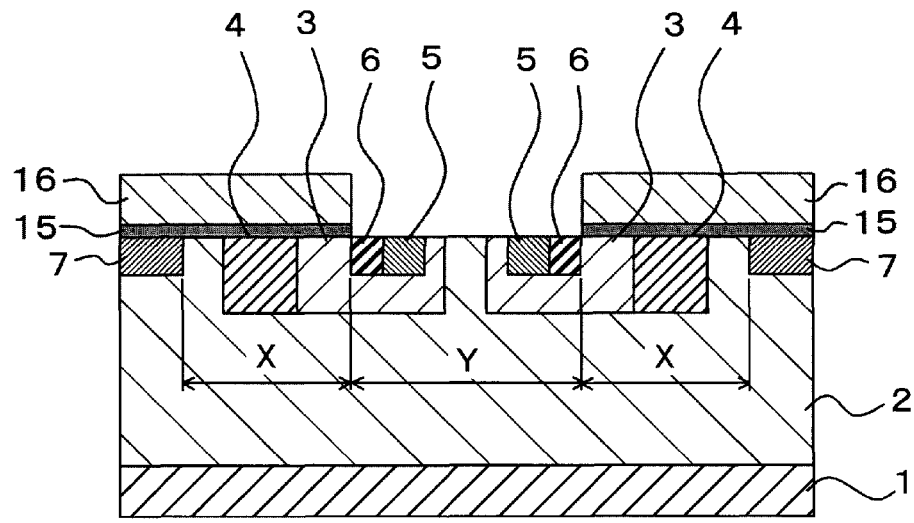
FIG. 6 is an illustrative diagram for explaining a manufacturing process of the silicon carbide semiconductor device (power MOSFET) according to Embodiment 1 of the present invention.
Figure 7:
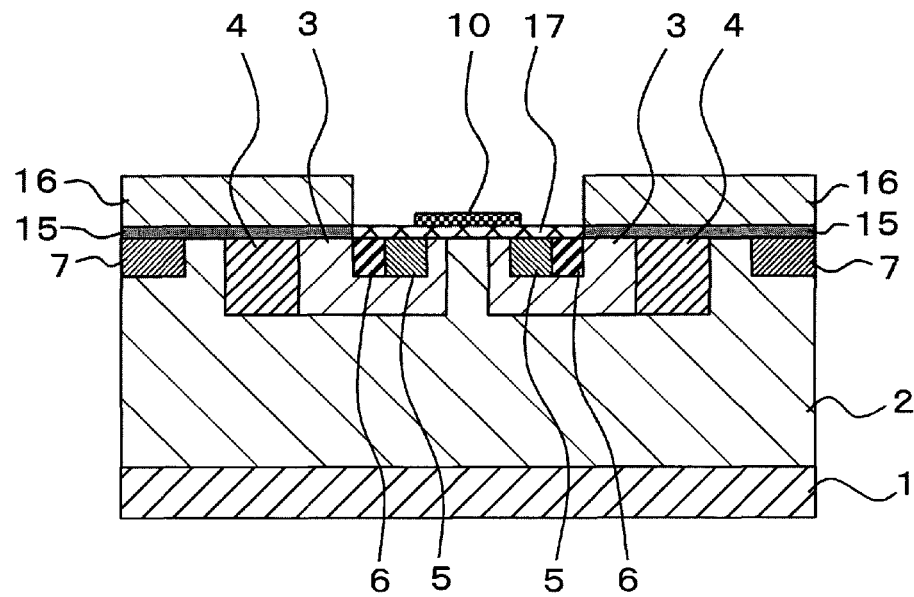
FIG. 7 is an illustrative diagram for explaining a manufacturing process of the silicon carbide semiconductor device (power MOSFET) according to Embodiment 1 of the present invention.
Figure 8:
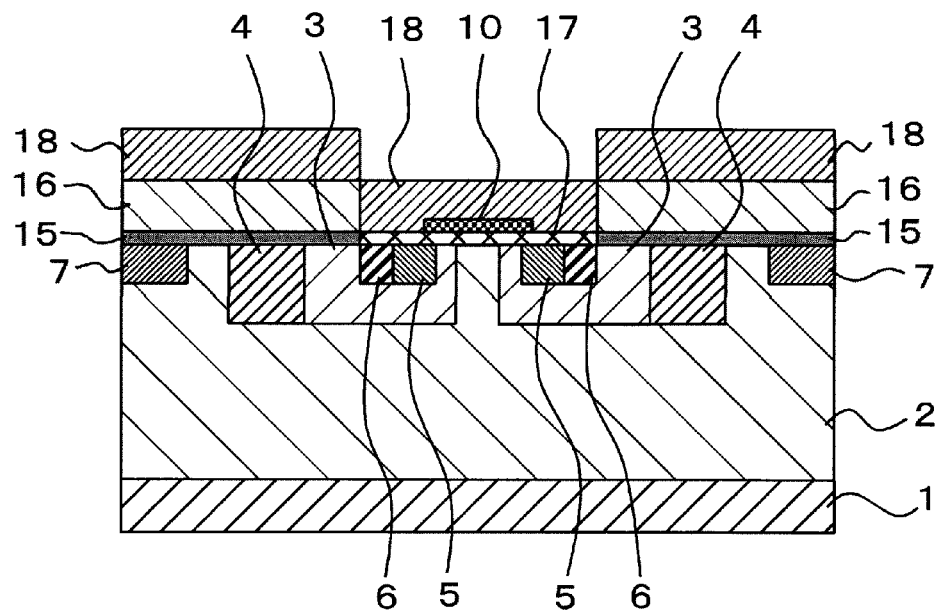
FIG. 8 is an illustrative diagram for explaining a manufacturing process of the silicon carbide semiconductor device (power MOSFET) according to Embodiment 1 of the present invention.
Figure 9:
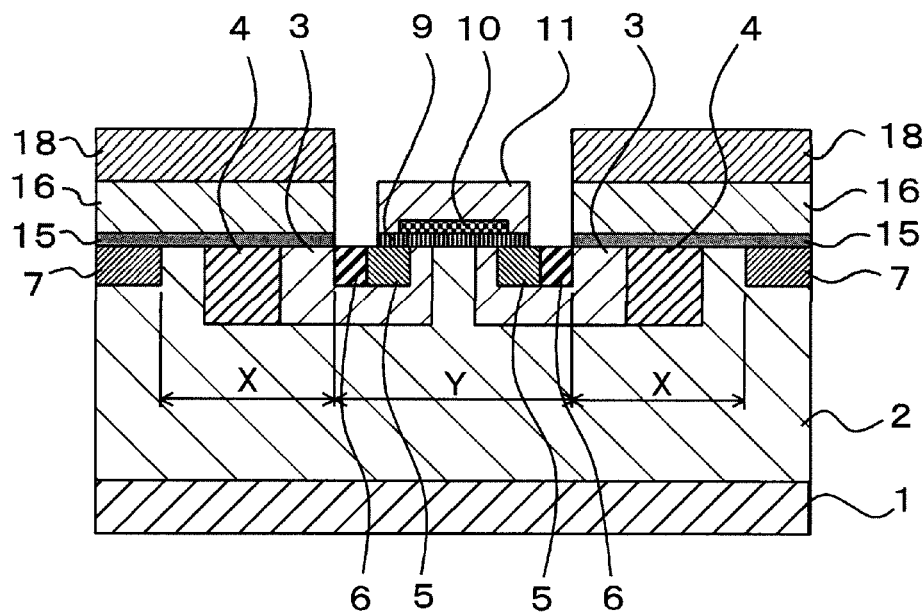
FIG. 9 is an illustrative diagram for explaining a manufacturing process of the silicon carbide semiconductor device (power MOSFET) according to Embodiment 1 of the present invention.
Figure 10:
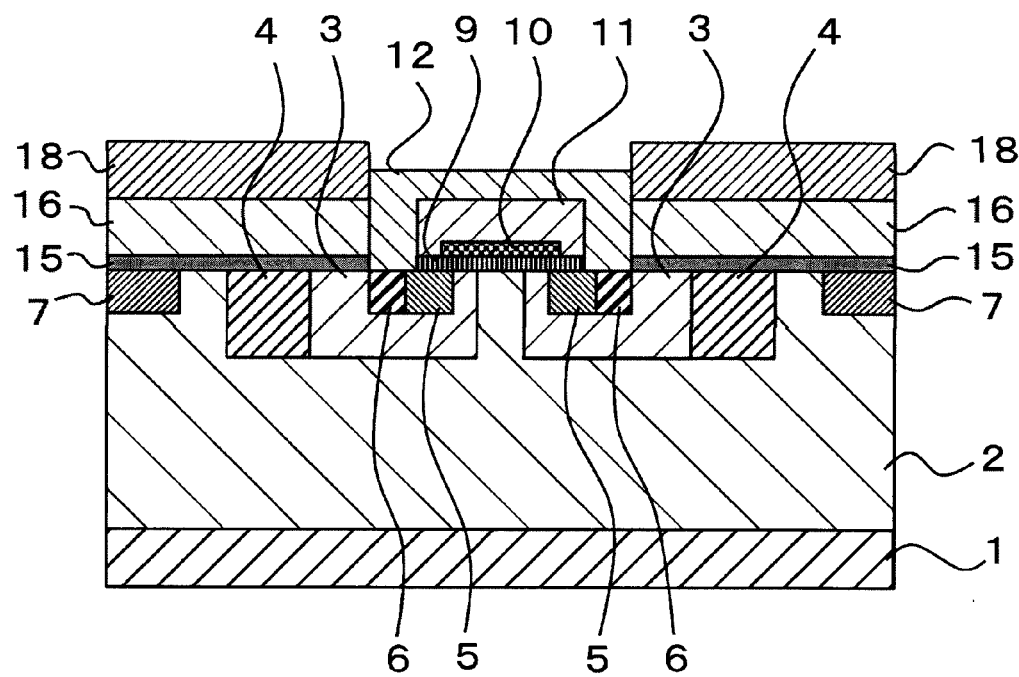
FIG. 10 is an illustrative diagram for explaining a manufacturing process of the silicon carbide semiconductor device (power MOSFET) according to Embodiment 1 of the present invention.
Figure 11:
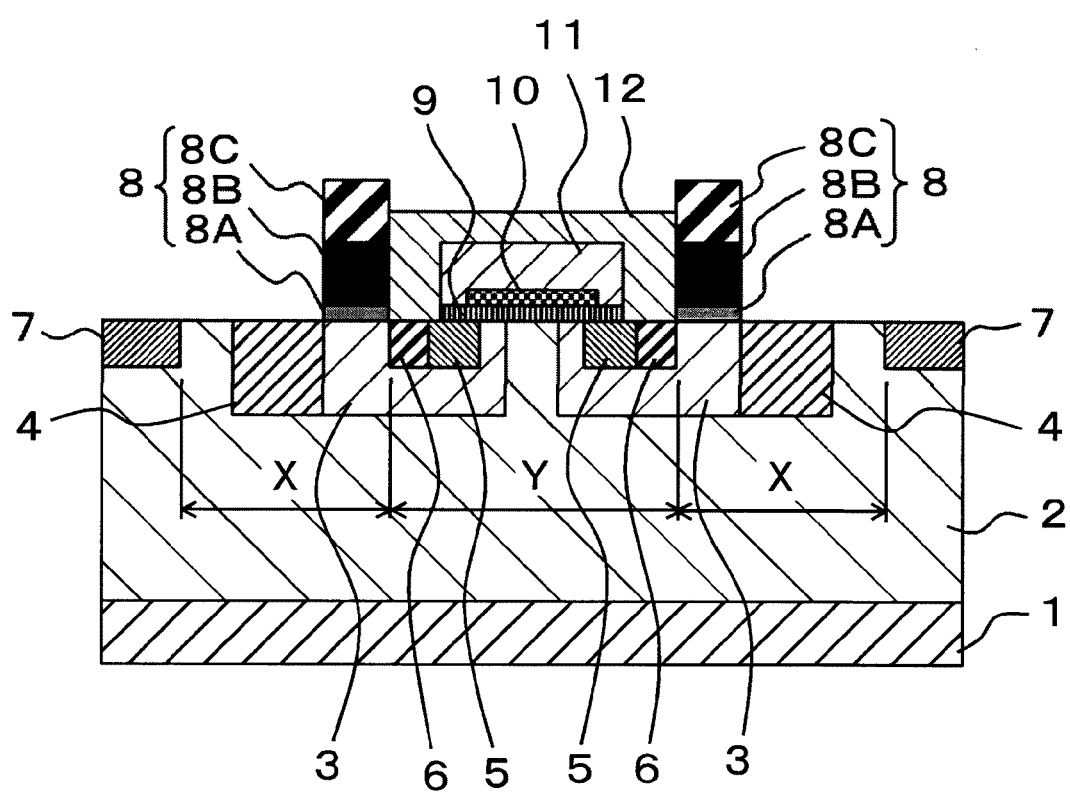
FIG. 11 is an illustrative diagram for explaining a manufacturing process of the silicon carbide semiconductor device (power MOSFET) according to Embodiment 1 of the present invention.
Figure 12:
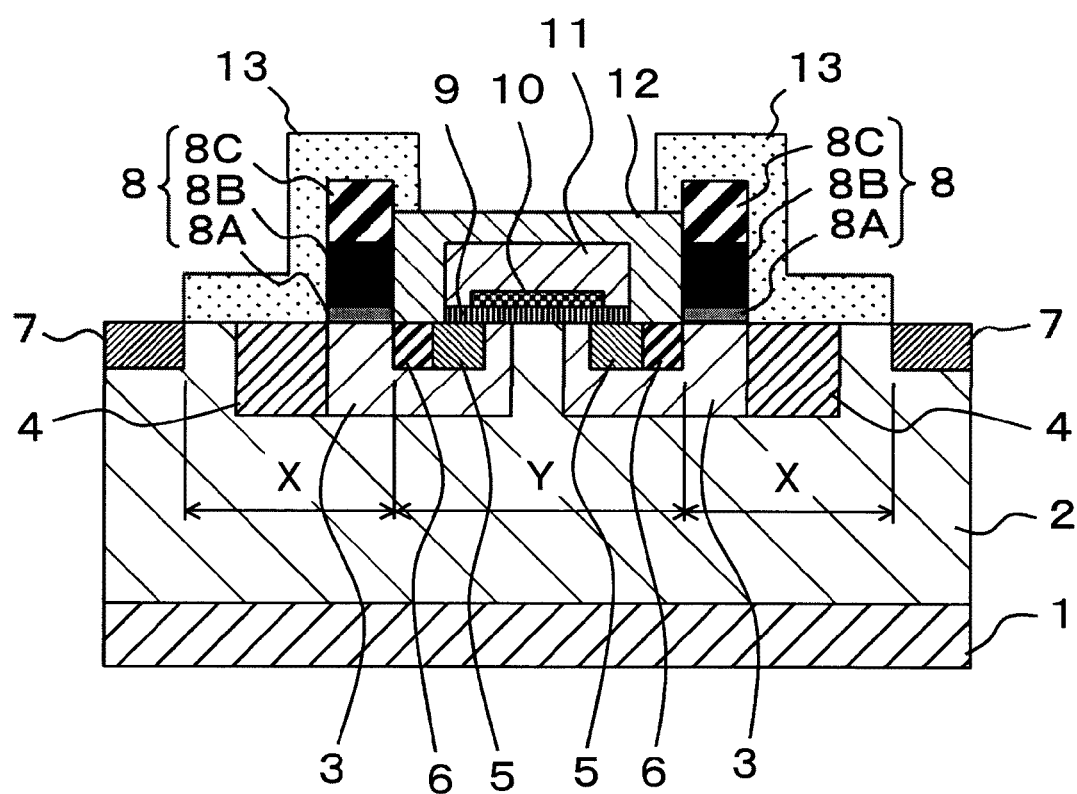
FIG. 12 is an illustrative diagram for explaining a manufacturing process of the silicon carbide semiconductor device (power MOSFET) according to Embodiment 1 of the present invention.

A cross-sectional structure viewed from a lateral side of a silicon carbide semiconductor device according to Embodiment 1 of the present invention is illustrated in FIG. 1. In addition, a cross-sectional structure viewed from the top side is illustrated in FIG. 2. Here, the cross-sectional structures are illustrated for a power MOSFET (power metal-oxide semiconductor field-effect transistor) as the silicon carbide semiconductor device. Note that, FIG. 1 shows a cross-section viewed along the arrows I-I of FIG. 2, and FIG. 2 shows a cross-section viewed along the arrows II-II of FIG. 1. Moreover, a method of manufacturing the power MOSFET illustrated in FIG. 1 and FIG. 2 is shown in FIG. 3 through FIG. 12.

First, the structure of the power MOSFET will be explained referring to FIG. 1 and FIG. 2.

Numeral "1" designates an $n^+$-type (first conductivity type) semiconductor substrate. Numeral "2" designates an $n^-$-type (first conductivity type) silicon carbide layer (drift layer). Numeral "3" designates a p-type (second conductivity type) well region as a first region. Numeral "4" designates an electric-field relaxation region of $p^-$-type (second conductivity type). This electric-field relaxation region comprises an electric-field relaxation structure such as a JTE or MFGR structure. Numeral "5" designates source regions of an $n^+$-type (first conductivity type). Numeral "6" designates $p^+$-type (second conductivity type) contact regions. Numeral "7" designates an $n^+$-type (first conductivity type) channel stopper region as a second region. Numeral "8" designates an inorganic protection film. This inorganic protection film 8 is in a multilayered structure, constituted of a thermal oxide film 8A, a first insulation film 8B and a second insulation film 8C in this order from the top side of the silicon carbide layer 2. Numeral "9" designates a gate oxide film. Numeral "10" designates a gate electrode. Numeral "11" is an interlayer insulation film. Numeral "12" designates a source electrode as a first main electrode. Numeral "13" designates an organic protection film. Numeral "14" designates a drain electrode as a second main electrode.

In addition, in FIG. 1 and FIG. 2, a termination end-portion for electric-field relaxation is in the range shown by "X" in the figures. The range of the termination end-portion X corresponds to each of the ranges from outer lateral end portions of the source electrode 12 to inner lateral end portions of the channel stopper region 7. Note that, the range Y in the interspace of the termination end-portion X is a cell portion that is driven as a semiconductor element (MOSFET).

Next, a method of manufacturing the power MOSFET illustrated in FIG. 1 and FIG. 2 will be explained referring to FIG. 3 through FIG. 12.

First, using an epitaxial crystal growth method, an n$^-$-type silicon carbide layer 2 made of silicon carbide is formed on a surface of an n$^+$-type semiconductor substrate 1. As for the semiconductor substrate 1, an n$^+$-type silicon carbide substrate is suitable in use, for example. A silicon carbide wafer is constituted by the semiconductor substrate 1 and the silicon carbide layer 2. (Refer to FIG. 3.)

Next, a p-type well region 3 is selectively formed as a first region in a zone having a spaced-apart region with a predetermined interval in the surface of the silicon carbide layer 2 by applying a resist as a mask and ion-implanting an impurity. Note that, as shown in FIG. 2, the well region 3 in the termination end-portion X is formed surrounding the cell portion Y. (Refer to FIG. 4, and FIG. 2.)

Next, by applying a resist as a mask and ion-implanting an impurity, an electric-field relaxation region 4 is formed surrounding the well region 3. (Refer to FIG. 4, and FIG. 2.)

As for the electric-field relaxation region 4, there is an electric-field relaxation structure such as a JTE or a MFGR, for example. Here, the JTE is formed with a p$^-$-type region having its impurity concentration relatively lower than the impurity concentration of the well region 3. In addition, the MFGR is formed such that a plurality of regions of the silicon carbide layer 2 and regions of a p-type are alternately placed on the outer lateral side of the well region 3 to constitute a p$^-$-type region whose average impurity concentration is relatively lower than the impurity concentration of the well region 3. It should be noted that, other than the JTE or the MFGR, there is also a structure called an FLR (field limiting ring), for example; however, its structure is comparable to that of the MFGR. Here, a region in which such an electric-field relaxation structure is formed is referred to as the electric-field relaxation region 4.

Next, in the top side of the well region 3, source regions 5 of an n$^+$-type are selectively formed by applying a resist as a mask and ion-implanting an impurity. (Refer to FIG. 4.)

Next, in the top side of the silicon carbide layer 2 and in an outer perimeter of the electric-field relaxation region 4, the n$^+$-type channel stopper region 7 is formed as a second region in a zone spaced apart, by an exposed region of the silicon carbide layer 2, from the electric-field relaxation region 4, by applying a resist as a mask and ion-implanting an impurity. Note that, a dicing region may be formed as the second region in place of the channel stopper region 7 when it is not formed. (Refer to FIG. 4.)

Next, in the top side of the well region 3, p$^+$-type (second conductivity type) contact regions 6 are selectively formed contacting with outer lateral surfaces of the source regions 5 by applying a resist as a mask and ion-implanting an impurity. (Refer to FIG. 4.)

Note that, specific examples for ion-implantation include phosphorous (P) and nitrogen (N) as the impurities that become an n-type. In addition, specific examples include boron (B) and aluminum (Al) as the impurities that become a p-type.

Next, heat treatment is performed for the silicon carbide wafer at high temperatures (for example, at 1500° C. for 30 minutes in argon (Ar) ambient). Because of this, implanted ions are electrically activated, and crystal defects formed by the ion implantation recover.

Next, an oxide film 15 made of silicon dioxide (SiO$_2$) is formed on the top-side surface of the silicon carbide wafer using a thermal oxidation method. The oxide film formed here is a thermal oxide film. (Refer to FIG. 5.)

Next, an insulation film 16 made of silicon dioxide (SiO$_2$) is formed on the top-side surface of the thermal oxide film 15, using a chemical vapor deposition method utilizing a TEOS gas. The insulation film 16 formed here is a TEOS oxide film. Note that, as for the insulation film 16, it is possible to use, other than the TEOS oxide film, an oxide film formed by another method than the thermal oxidation, such as a BPSG (boro-phospho silicated glass) film. (Refer to FIG. 5.)

Next, by applying a resist as a mask and using a method of wet etching or plasma-using etching, portions of the oxide film 15 and the insulation film 16 are removed other than those on the area of the termination end-portion X and the channel stopper region 7. Because of this, the contact regions 6 and the source regions 5, as well as portions of the well region 3 and the silicon carbide layer 2 that are placed between the source regions 5 are exposed in the cell portion Y. (Refer to FIG. 6.)

Next, an oxide film 17 made of silicon dioxide (SiO$_2$) is formed on the exposed top-side surfaces of the contact regions 6 and the source regions 5, as well as the well region 3 and the silicon carbide layer 2 that are placed between the source regions 5, using a thermal oxidation method. The oxide film 17 formed here is a thermal oxide film. (Refer to FIG. 7.)

Next, a polysilicon film is formed on the top-side surface of the oxide film 17 using a chemical vapor deposition method. Subsequently, unwanted parts of the polysilicon film are removed so as to form a gate electrode 10, by applying a resist as a mask and using a method of wet etching or plasma-using etching. The gate electrode 10 is formed to cover a MOS channel region between the source regions 5. (Refer to FIG. 7.)

Next, an insulation film 18 made of silicon dioxide (SiO$_2$) is formed on the top-side surface of the silicon carbide wafer, by a chemical vapor deposition method utilizing a TEOS gas. The insulation film 18 formed here is a TEOS oxide film. Note that, as the insulation film 18, an oxide film other than a thermal oxide film, such as a BPSG film may be formed in place of the TEOS oxide film. (Refer to FIG. 8.)

Next, by applying a resist as a mask and using a method of wet etching or plasma-using etching, portions of the insulation film 18 and the oxide film 17 in a range of the cell portion Y are removed so that the insulation film 18 is kept remaining in an area to cover the gate electrode 10, and the contact regions 6 and parts of the source regions 5 are exposed. Because of this, a gate oxide film 9 and an interlayer insulation film 11 are formed. (Refer to FIG. 9.)

Next, a source electrode 12 is formed on exposed top-side surfaces of the contact regions 6, the source regions 5, and the interlayer insulation film 11 by applying a resist as a mask and using a physical vapor deposition method such as sputtering. Specific examples for a material that becomes a source electrode 12 include aluminum (Al) and nickel (Ni). (Refer to FIG. 10.)

Next, by applying a resist as a mask and using a method of wet etching or plasma-using etching, portions of the oxide film 15, the insulation film 16 and the insulation film 18 are removed that are on the surface of the termination end-portion X excluding those on the well region 3, and that are on the surface of the channel stopper region 7. Because of this, the electric-field relaxation region 4 and the silicon carbide layer 2 are exposed in the areas of the termination end-portion X. In addition, the channel stopper region 7 is exposed at the same time. Moreover, here formed is an inorganic protection film 8 that is constituted of a thermal oxide film 8A, a first insulation film 8B and a second insulation film 8C shown in FIG. 1. (Refer to FIG. 11.)

Next, using a method of coating, an organic protection film 13 is formed so as to cover the termination end-portion X. Specifically, in the termination end-portion X, an organic protection film 13 is formed on the exposed surfaces of the electric-field relaxation region 4 and the silicon carbide layer 2, and on the surface of the inorganic protection film 8. As for the organic protection film 13, a film can be used if it has a high electrical insulation capability with a little influence by electric charges. For example, a polyimide film or a silicone film is suitable in use. (Refer to FIG. 12.)

Lastly, using a physical vapor deposition method such as sputtering, a drain electrode 14 is formed on the bottom face of the semiconductor substrate 1. Specific examples for a material that becomes the drain electrode 14 include aluminum (Al) and nickel (Ni).

According to the manner described above, the main part of the power MOSFET illustrated in FIG. 1 and FIG. 2, which is a silicon carbide semiconductor device, is completed.

Figure 13:
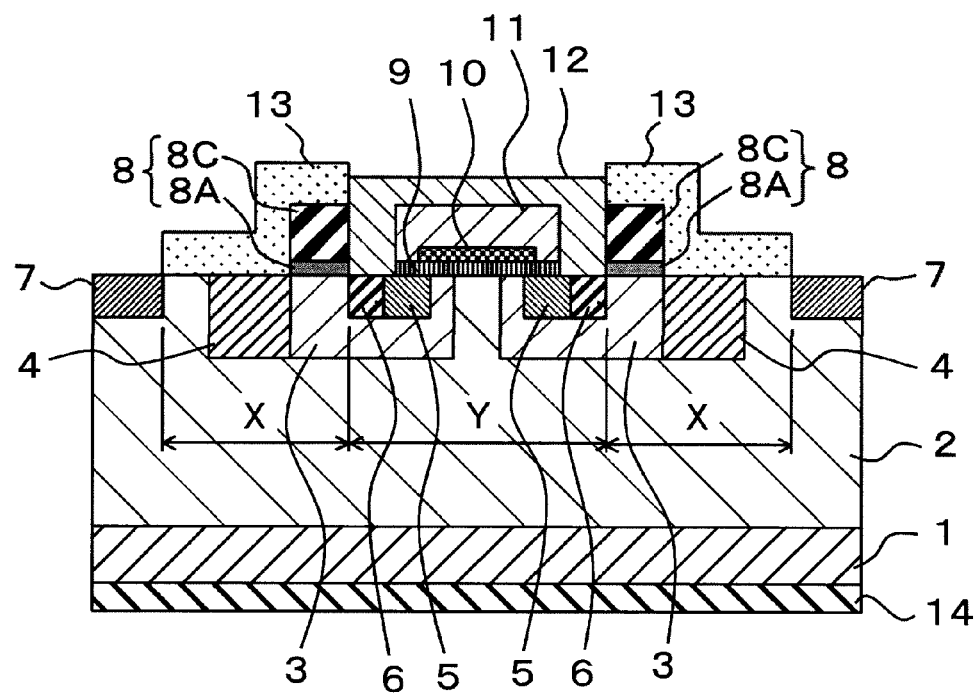
FIG. 13 is a longitudinal section diagram illustrating another structure of a silicon carbide semiconductor device (power MOSFET) according to Embodiment 1 of the present invention.
Figure 14:
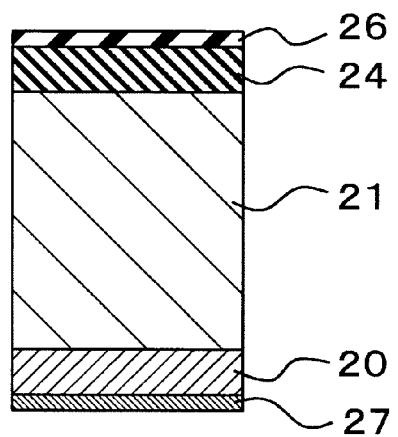
FIG. 14 is a longitudinal section diagram illustrating a test sample (sample A) used for measuring a flat band voltage in a working example according to Embodiment 1 of the present invention.
Figure 15:
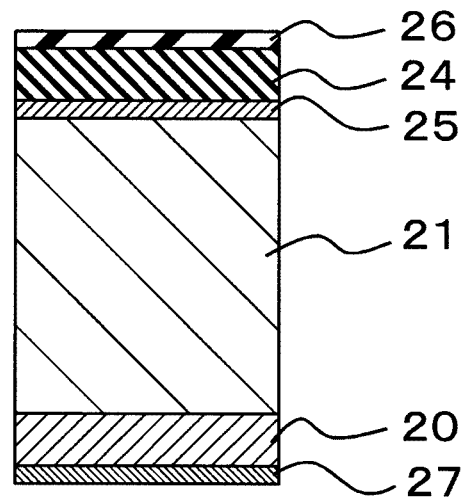
FIG. 15 is a longitudinal section diagram illustrating another test sample (sample B) used for measuring a flat band voltage in the working example according to Embodiment 1 of the present invention.
Figure 16:
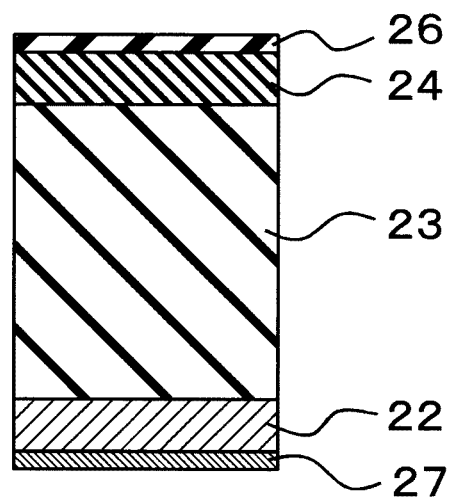
FIG. 16 is a longitudinal section diagram illustrating another test sample (sample C) used for measuring a flat band voltage in the working example according to Embodiment 1 of the present invention.
Figure 17:
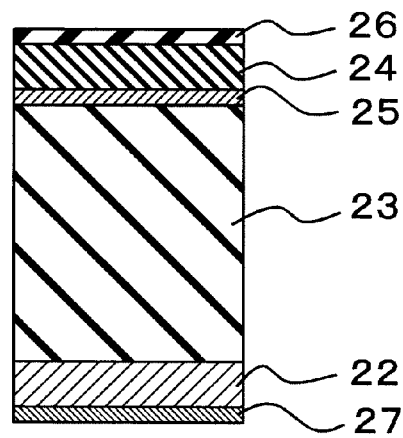
FIG. 17 is a longitudinal section diagram illustrating another test sample (sample D) used for measuring a flat band voltage in the working example according to Embodiment 1 of the present invention.

Note that, in FIG. 1, the inorganic protection film 8 is shown that is formed by layering a thermal oxide film 8A, a first insulation film 8B and a second insulation film 8C; however, an inorganic protection film 8 may be constituted of a thermal oxide film 8A and a second insulation film 8C as shown in FIG. 13. In this case, the first insulation film 8B may be removed, or not formed as the above film for layering from the beginning.

Next, the explanation will be made for the fact based on an experimental example that, according to the termination end-portion X of the silicon carbide semiconductor device according to Embodiment 1 of the present invention, it is possible to ensure both stability of its withstand voltage and reliability in high-temperature operations by forming the inorganic protection film 8 on the top-side surface of the well region 3, and by forming the organic protection film 13 on the top-side surfaces of the electric-field relaxation region 4 and the silicon carbide layer 2.

EXPERIMENTAL EXAMPLE

In this example, firstly, test samples (test sample A through test sample D) having four kinds of MOS capacitors are prepared as shown in FIG. 14 through FIG. 17, and flat band voltages are measured for the respective test samples. And then, effective fixed electric-charge densities of the respective test samples are evaluated from the amounts of shift of the flat band voltages.

The test samples A and B use a silicon carbide wafer of an n-type (first conductivity type) formed with an n$^-$-type (first conductivity type) silicon carbide layer 21 grown as an epitaxial crystal on an n$^+$-type (first conductivity type) silicon carbide substrate 20. The test samples C and D use a silicon carbide wafer of a p-type (second conductivity type) formed with a p$^-$-type (second conductivity type) silicon carbide layer 23 grown as an epitaxial crystal on a p$^+$-type (second conductivity type) silicon carbide substrate 22.

In the test sample A, an oxide film 24 is formed as an inorganic protection film on the surface of the n-type silicon carbide wafer, using a chemical vapor deposition method utilizing a TEOS gas. In the test sample B, a thermal oxide film 25 is further formed in a corresponding structure to the test sample A, as an inorganic protection film placed between the silicon carbide wafer and the oxide film 24, using a thermal oxidation method.

In the test sample C, an oxide film 24 is formed as an inorganic protection film on the surface of the p-type silicon carbide wafer, using a chemical vapor deposition method utilizing a TEOS gas. In the test sample D, a thermal oxide film 25 is further formed in a corresponding structure to the test sample C, as an inorganic protection film placed between the silicon carbide wafer and the oxide film 24, using a thermal oxidation method.

In addition, in order to measure flat band voltages, in each of the test samples A through D, electrode pads 26 and 27 are formed on the surface of the oxide film and the bottom face of the silicon carbide wafer, respectively. Note that, in FIG. 14 through FIG. 17, the same reference numerals designate the same items as, or the items corresponding to, those shown in the figures.

The effective fixed electric-charge densities each evaluated from the amount of shift of the flat band voltages measured for the test samples A through D are 2.7 to $4.6 \times 10^{12}$ cm$^{-2}$ for the test sample A, 2.8 to $8.8 \times 10^{11}$ cm$^{-2}$ for the test sample B, 6.2 to $6.6 \times 10^{12}$ cm$^{-2}$ for the test sample C, and 3.2 to $4.1 \times 10^{12}$ cm$^{-2}$ for the test sample D.

The lower the effective fixed electric-charge density of an inorganic protection film is, the better it is from a viewpoint of a withstand voltage. This shows that, as the inorganic protection film, a layered structure of oxide films is suitable that is formed with a thermal oxide film and an oxide film using a chemical vapor deposition method. And, when such an inorganic protection film in the layered structure is used, effective fixed electric-charge density becomes $1.0 \times 10^{12}$ cm$^{-2}$ in the inorganic protection film formed on the top-side surface of the n-type silicon carbide wafer at the highest estimate, and effective fixed electric-charge density in the inorganic protection film formed on the top-side surface of the p-type silicon carbide wafer does $5.0 \times 10^{12}$ cm$^{-2}$ at the highest estimate.

A silicon carbide layer of the silicon carbide wafer having impurity density that is approximately the same as the effective fixed electric-charge density in the inorganic protection film formed on the top-side surface of the silicon carbide wafer is influenced by the effective fixed electric-charge density in the inorganic protection film, so that a depletion-layer formation condition changes. Because of the change, a withstand voltage of the silicon carbide semiconductor device is influenced.

When the impurity density of the silicon carbide layer of the silicon carbide wafer is made at least as high as five times, preferably as high as ten times, or more preferably as high as twenty times the effective fixed electric-charge density in the inorganic protection film, it is possible to disregard an influence by the effective fixed electric-charge density in the inorganic protection film. Because the change in a depletion-layer formation condition can be disregard here, it becomes possible to disregard the influence to the withstand voltage of the silicon carbide semiconductor device.

More specifically speaking in the case of the n-type silicon carbide wafer, an influence by the effective fixed electric-charge density in the inorganic protection film cannot be disregarded, when surface density of donor of the silicon carbide layer 21 is not higher than, or approximately the same as, $5.0 \times 10^{12}$ cm$^{-2}$ that is five times the fixed electric-charge density of $1.0 \times 10^{12}$ cm$^{-2}$ in the inorganic protection film described above.

In other words, when an inorganic protection film on a top-side surface of the silicon carbide layer 21 is removed in a region in which the surface density of donor of the silicon carbide layer 21 is not higher than or approximately the same as $5.0 \times 10^{12}$ cm$^{-2}$, preferably not higher than or approximately the same as $1.0 \times 10^{13}$ cm$^{-2}$ that is ten times the fixed electric-charge density of $1.0 \times 10^{12}$ cm$^{-2}$ in the inorganic protection film, or more preferably not higher than or approximately the same as $2.0 \times 0^{13}$ cm$^{-2}$ that is twenty times the fixed electric-charge density of $1.0 \times 10^{12}$ cm$^{-2}$ in the inorganic protection film, there will be no influence on a formation condition of a depletion layer. For this reason, the withstand voltage becomes stabilized.

Note that, the surface density of donor is a product of the thickness of the silicon carbide layer 21 and an impurity density in the silicon carbide layer 21.

In addition, in the case of the p-type silicon carbide wafer, an influence by the effective fixed electric-charge density in the inorganic protection film cannot be disregarded, when surface density of acceptor in the silicon carbide layer 23 is not higher than, or approximately the same as, $2.5 \times 10^{13}$ cm$^{-2}$ that is five times the fixed electric-charge density of $5.0 \times 10^{12}$ cm$^{-2}$ in the inorganic protection film described above.

In other words, when an inorganic protection film on a top-side surface of the silicon carbide layer 23 is removed in a region in which surface density of acceptor of the silicon carbide layer 23 is not higher than or approximately the same as $2.5 \times 10^{13}$ cm$^{-2}$, preferably not higher than or approximately the same as $5.0 \times 10^{13}$ cm$^{-2}$ that is ten times the fixed electric-charge density of $5.0 \times 10^{12}$ cm$^{-2}$ in the inorganic protection film, or more preferably not higher than or approximately the same as $1.0 \times 10^{14}$ cm$^{-2}$ that is twenty times the fixed electric-charge density of $5.0 \times 10^{12}$ cm$^{-2}$ in the inorganic protection film, there will be no influence on a formation condition of a depletion layer. For this reason, the withstand voltage becomes stabilized.

Note that, the surface density of acceptor is a product of the thickness of the silicon carbide layer 23 and an impurity density in the silicon carbide layer 23.

The withstand voltage of a silicon carbide semiconductor device is usually required to be 1.2 kV or higher on a design basis. In order to satisfy the requirement, acceptor surface-density of the well region 3 is to be approximately $2.0 \times 10^{14}$ cm$^{-2}$; acceptor surface-density of an electric-field relaxation region 4, approximately $2.0 \times 10^{13}$ cm$^{-2}$; and donor surface-density of a silicon carbide layer 2 that is a drift layer, approximately $1.0 \times 10^{13}$ cm$^{-2}$.

Here, acceptor surface-densities of the well region 3 and the electric-field relaxation region 4, and a donor surface-density of the silicon carbide layer 2, that are required on the withstand-voltage design basis, are compared with an acceptor surface-density of the p-type silicon carbide layer 23 and a donor surface-density of the n-type silicon carbide layer 21, that are determined as necessary to exert influence on the withstand voltage by evaluating the test samples A through D.

First, when consideration is given to the well region 3, its acceptor surface-density required on the design basis is approximately $2.0 \times 10^{14}$ cm$^{-2}$, and from the evaluation result of the test samples, its acceptor surface-density that exerts influence on the withstand voltage is lower than or equal to $2.5 \times 10^{13}$ cm$^{-2}$. The value of approximately $2.0 \times 10^{14}$ cm$^{-2}$ that is the acceptor surface-density required on the design basis, is higher than the value of $2.5 \times 10^{13}$ cm$^{-2}$ that is the acceptor surface-density which exerts influence on the withstand voltage. Consequently, it can be said that an influence by the inorganic protection film 8 can be disregarded. Therefore, it is not necessary to remove the inorganic protection film 8.

Next, when consideration is given to the electric-field relaxation region 4, its acceptor surface-density required on the design basis is approximately $2.0 \times 10^{13}$ cm$^{-2}$, and from the evaluation result of the test samples, its acceptor surface-density that exerts influence on the withstand voltage is lower than or equal to $2.5 \times 10^{13}$ cm$^{-2}$. The value of approximately $2.0 \times 10^{13}$ cm$^{-2}$ that is the acceptor surface-density required on the design basis, is not higher than or almost equal to, the value of $2.5 \times 10^{13}$ cm$^{-2}$ that is the acceptor surface-density which exerts influence on the withstand voltage. Consequently, it can be said that an influence by the inorganic protection film 8 cannot be disregarded. Therefore, it is necessary to remove the inorganic protection film 8.

Lastly, when consideration is given to the silicon carbide layer 2, its donor surface-density required on the design basis is approximately $1.0 \times 10^{13}$ cm$^{-2}$, and from the evaluation result of the test samples, its acceptor surface-density that exerts influence on the withstand voltage is lower than or equal to $5.0 \times 10^{12}$ cm$^{-2}$. In this case, the value of approximately $1.0 \times 10^{13}$ cm$^{-2}$ that is the donor surface-density required on the design basis is higher than the value of $5.0 \times 10^{12}$ cm$^{-2}$ that is the acceptor surface-density which exerts influence on the withstand voltage, and thus it can be said that an influence by the inorganic protection film 8 can be disregarded, and that removal of the inorganic protection film 8 is not necessary. However, in the case of such a silicon carbide layer 2 of an n-type, the impurity density of the silicon carbide layer 2 is lower than the impurity density of the electric-field relaxation region 4, and a depletion layer is thus easily extendable to mainly the side of the n-type silicon carbide layer 2, and therefore, the influence that exerts on the withstand voltage is considered to be larger. For this reason, as the donor surface-density that exerts influence on the withstand voltage, it is desirably better to count on the degree of further two times (the degree of ten times the fixed electric-charge density of $1.0 \times 10^{12}$ cm$^{-2}$ in the inorganic protection film), namely the degree of $1.0 \times 10^{13}$ cm$^{-2}$ to be on a secure side. Given this perspective, the value of approximately $1.0 \times 10^{13}$ cm$^{-2}$ that is the donor surface-density required on the design basis becomes comparable to the value of $1.0 \times 10^{13}$ cm$^{-2}$ including a margin to the value of $5.0 \times 10^{12}$ cm$^{-2}$ that is the acceptor surface-density which exerts influence on the withstand voltage. Therefore, it is preferable that the inorganic protection film 8 be removed.

According to the foregoing, it is preferable that, in the termination end-portion X, an inorganic protection film 8 on a top-side surface of the well region 3 be kept remaining, and an inorganic protection film 8 on top-side surfaces of the electric-field relaxation region 4 and the silicon carbide layer 2 be removed. Note that, in order to give protection against the influence by foreign substance or moisture, the exposed electric-field relaxation region 4 and silicon carbide layer 2 from which parts of the inorganic protection film 8 have been removed, are protected by an organic protection film having a high electrical insulation capability with a little influence by electric charges such as a polyimide film or a silicone film.

Accordingly, a withstand voltage of the power MOSFET that is the silicon carbide semiconductor device is stabilized. In addition, the inorganic protection film 8 having high heat resistance is formed in the termination end-portion X on its side nearer to the cell portion Y, and the organic protection film 13 is formed apart from the cell portion Y, so that it is possible to prevent the organic protection film 13 from degrading due to heat generation during the energization or when a surge current flows. For this reason, it is possible to also secure reliability in high-temperature operations.

In the silicon carbide semiconductor device according to Embodiment 1 of the present invention, the termination end-portion X provided for relaxing the electric field is provided with the inorganic protection film 8 that is formed on the exposed surface of the well region 3, and the organic protection film 13 that is formed on the exposed surface of the electric-field relaxation region 4 and on the exposed surface portion of the silicon carbide layer 2, so that a silicon carbide semiconductor device can be attained that ensures both stability of withstand voltage and reliability in high-temperature operations in the termination end-portion X.

Figure 18:
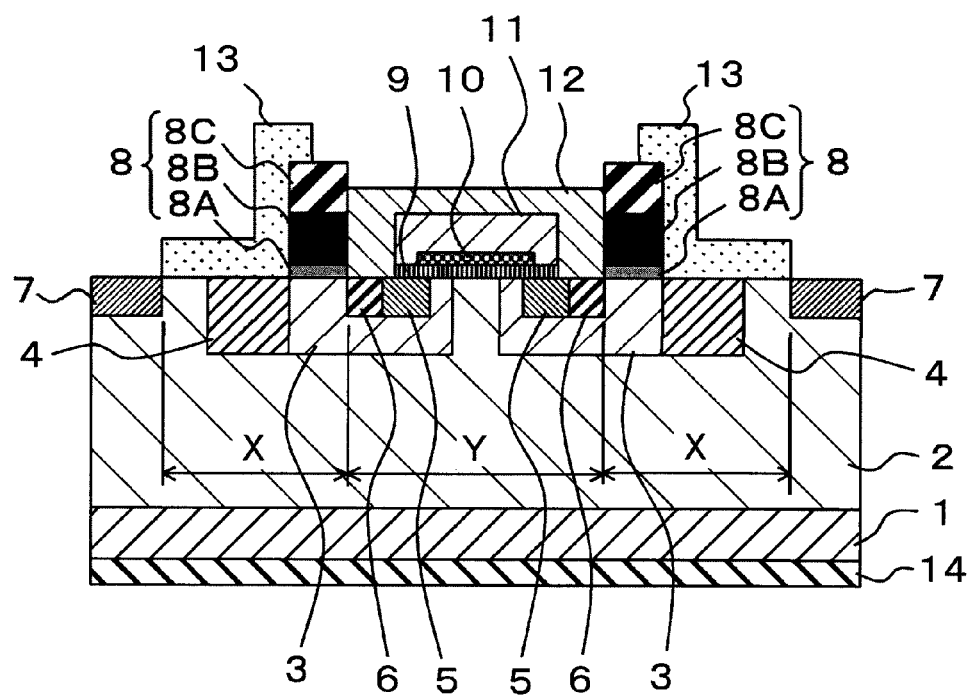
FIG. 18 is a longitudinal section diagram illustrating another structure of a silicon carbide semiconductor device (power MOSFET) according to Embodiment 1 of the present invention.
Figure 19:
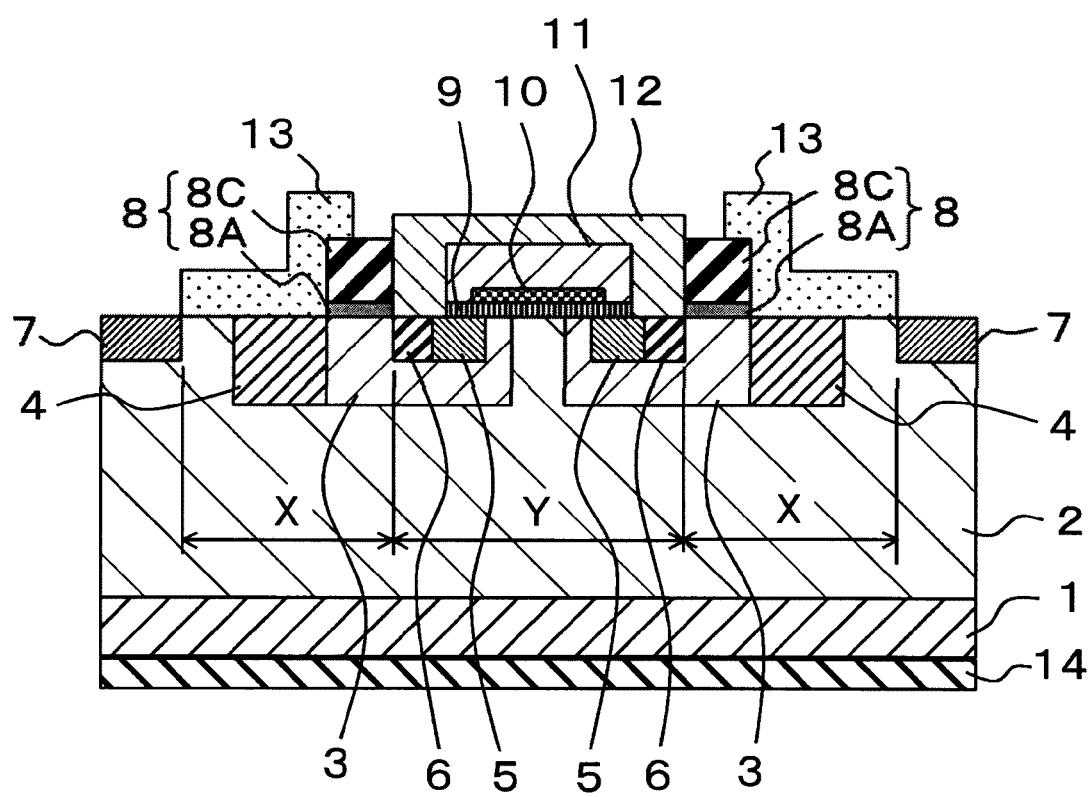
FIG. 19 is a longitudinal section diagram illustrating another structure of a silicon carbide semiconductor device (power MOSFET) according to Embodiment 1 of the present invention.

Note that, in FIG. 1, FIG. 2 and FIG. 13, the organic protection film 13 is in contact with the source electrode 12; however, it is possible that the organic protection film 13 be not in contact with the source electrode 12 as shown in FIG. 18 and FIG. 19. In this case, it is possible to prevent heat that is generated during the energization or when a surge current flows, from transferring to the organic protection film 13 by way of the source electrode 12. For this reason, it becomes possible to further prevent thermal degradation of the organic protection film 13. Note that, in FIG. 18 and FIG. 19, the organic protection film 13 covers the parts of the inorganic protection film 8; however, it is simply required that the organic protection film cover at least surface portions of the electric-field relaxation region 4 and the silicon carbide layer 2 that are the exposed portions in the termination end-portion X. In addition, in FIG. 18, the inorganic protection film 8 is shown that is constituted of a thermal oxide film 8A, a first insulation is film 8B and a second insulation film 8C, and in FIG. 19, the inorganic protection film 8 is shown that is constituted of the thermal oxide film 8A and the second insulation film 8C. Moreover, in FIG. 18 and FIG. 19, the same reference numerals and symbols designate the same items as, or the items corresponding to, those shown in FIG. 1 and FIG. 2.

Figure 20:
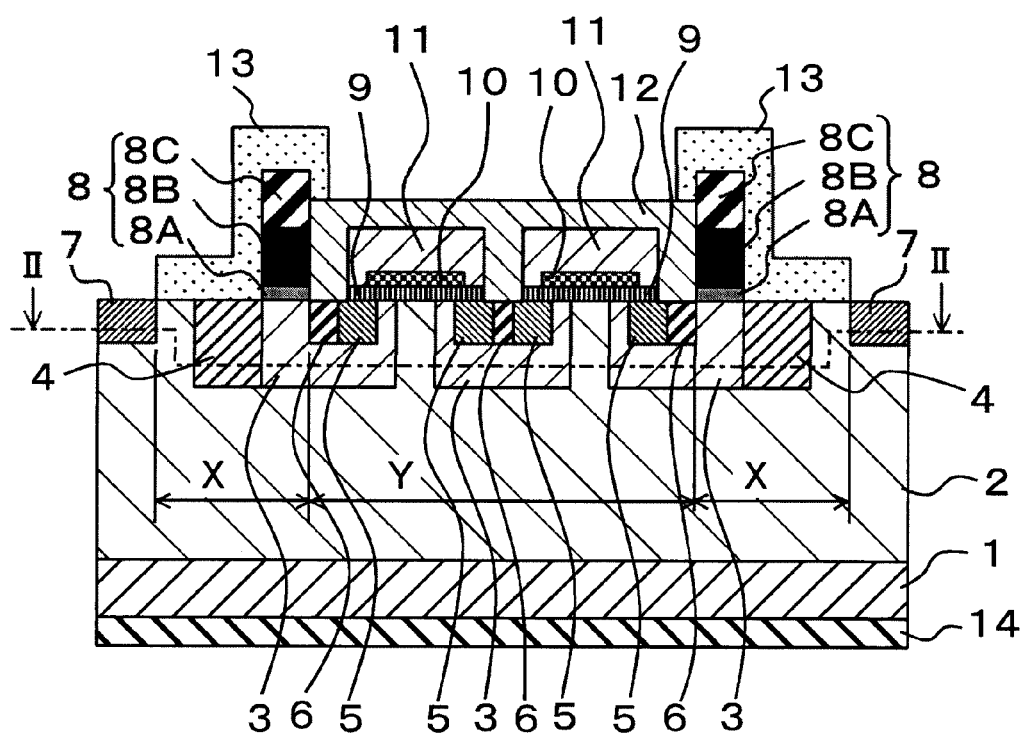
FIG. 20 is a longitudinal section diagram illustrating another structure of a silicon carbide semiconductor device (power MOSFET) according to Embodiment 1 of the present invention.
Figure 21:
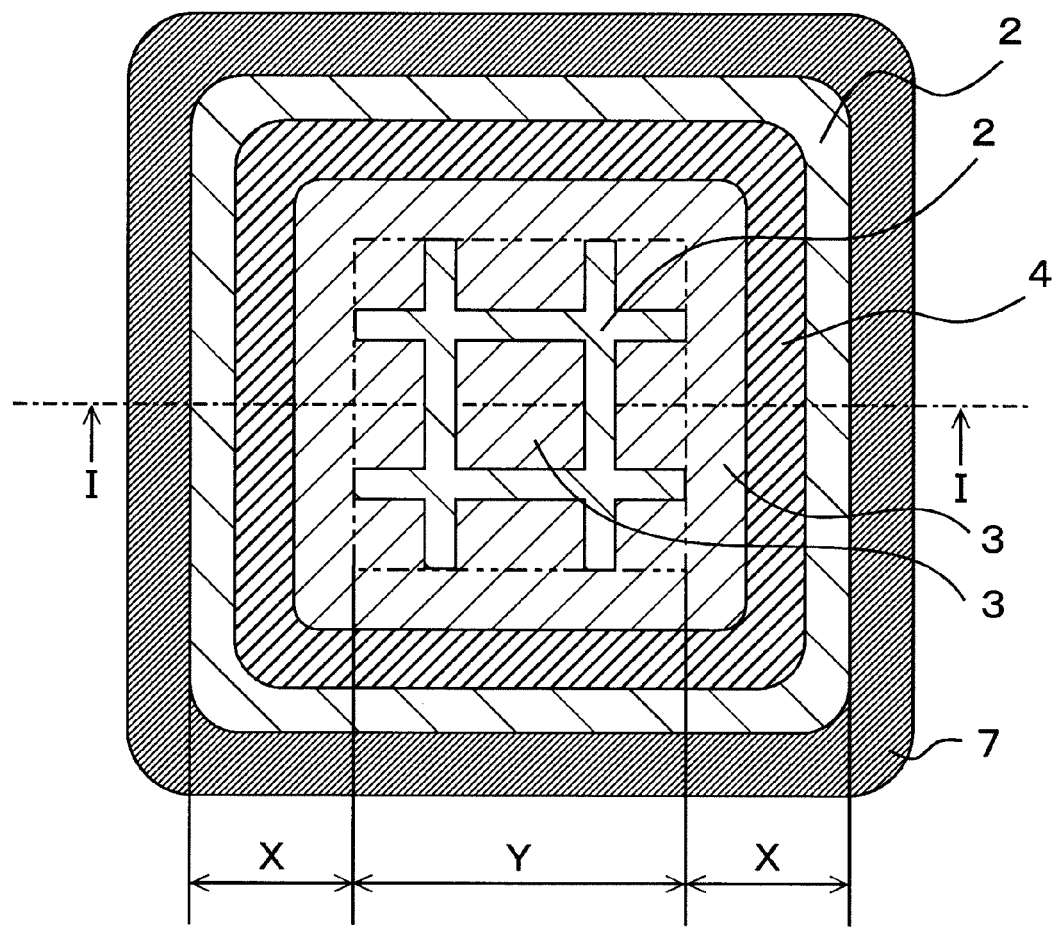
FIG. 21 is a lateral section diagram illustrating another structure of the silicon carbide semiconductor device (power MOSFET) according to Embodiment 1 of the present invention.

In addition, illustrated in FIG. 1 and FIG. 2 are the structures of the device in which one cell is included in the cell portion Y that is driven as a semiconductor element; however, another structure may be adopted in which a plurality of cells are included in the cell portion Y as illustrated in a longitudinal section diagram of FIG. 20 and a lateral section diagram of FIG. 21. Note that, in FIG. 20 and FIG. 21, a silicon carbide semiconductor device having two cells is illustrated as an example having a plurality of cells in the cell portion Y. In addition, FIG. 20 shows a cross-section viewed along the arrows I-I of FIG. 21, and FIG. 21 shows a cross-section viewed along the arrows II-II of FIG. 20. Also in FIG. 20 and FIG. 21, the same reference numerals and symbols designate the same items as, or the items corresponding to, those shown in FIG. 1 and FIG. 2.

Figure 22:
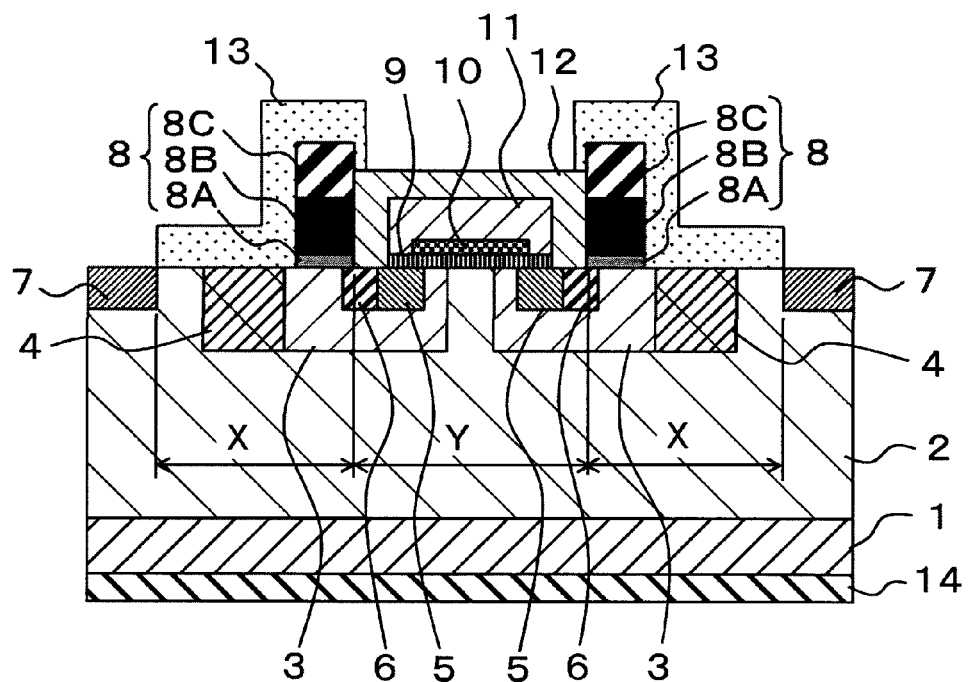
FIG. 22 is a longitudinal section diagram illustrating another structure of a silicon carbide semiconductor device (power MOSFET) according to Embodiment 1 of the present invention.

Moreover, illustrated in FIG. 1 is provided with the organic protection film 13 formed on the top-side surface of the electric-field relaxation region 4 and on the top-side surface portion of the silicon carbide layer 2; however, the organic protection film 13 can be formed so as to extend onto a top-side surface of an outer edge portion of the well region 3, as shown in FIG. 22.

Similarly, the inorganic protection film 8 can be formed so as to extend onto the top-side surfaces of outer edge portions of the contact regions 6, as shown in FIG. 22. This is because the impurity concentration of the contact regions 6 is relatively higher than impurity concentration of the well region 3, and therefore as a matter of course, it is higher than the acceptor surface-density that exerts influence on the withstand voltage. On the contrary, it should be avoided that the inorganic protection film 8 is formed on the top-side surface of the electric-field relaxation region 4. This is because the acceptor surface-density of the electric-field relaxation region 4 is to be the acceptor surface-density that exerts influence on the withstand voltage.

As described above, in order to ensure design flexibility for the inorganic protection film 8 and the organic protection film 13, it is important that the organic protection film 13 is allowed to be formed on the top-side surfaces of an outer edge portion of the well region 3, and the inorganic protection film 8 is allowed to be formed on the top-side surfaces of outer edge portions of the contact regions 6.

Although the exemplary explanation is made for the power MOSFET as the silicon carbide semiconductor device in Embodiment 1, any silicon carbide semiconductor device having the termination end-portion X as shown in FIG. 1 and FIG. 2 can achieve those effects similar to the effects described in Embodiment 1. In what follows, other examples of a silicon carbide semiconductor device having such termination end-portion X will be explained.

Embodiment 2

Figure 23:
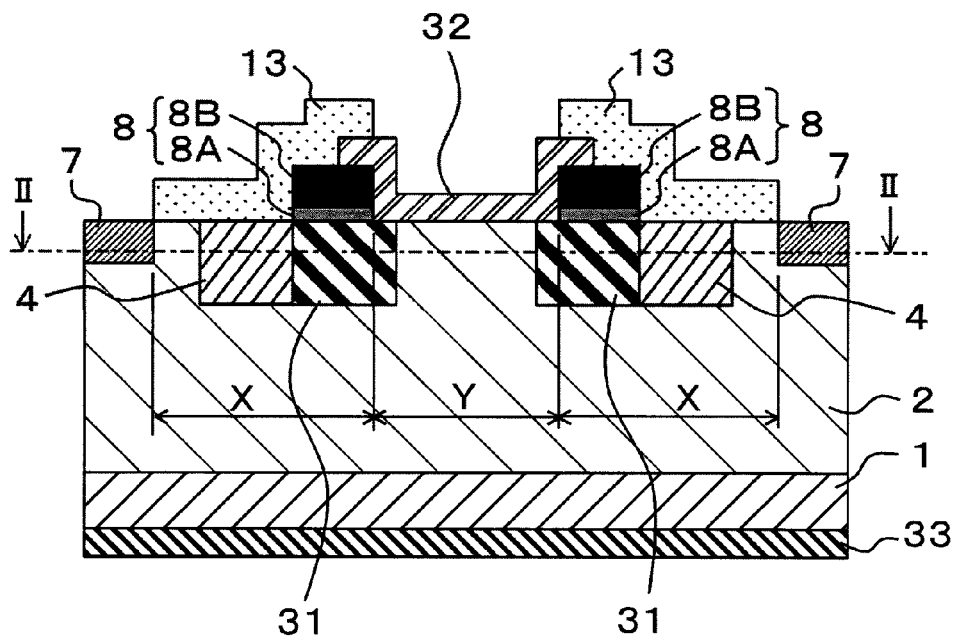
FIG. 23 is a longitudinal section diagram illustrating a structure of a silicon carbide semiconductor device (Schottky diode) according to Embodiment 2 of the present invention.
Figure 24:
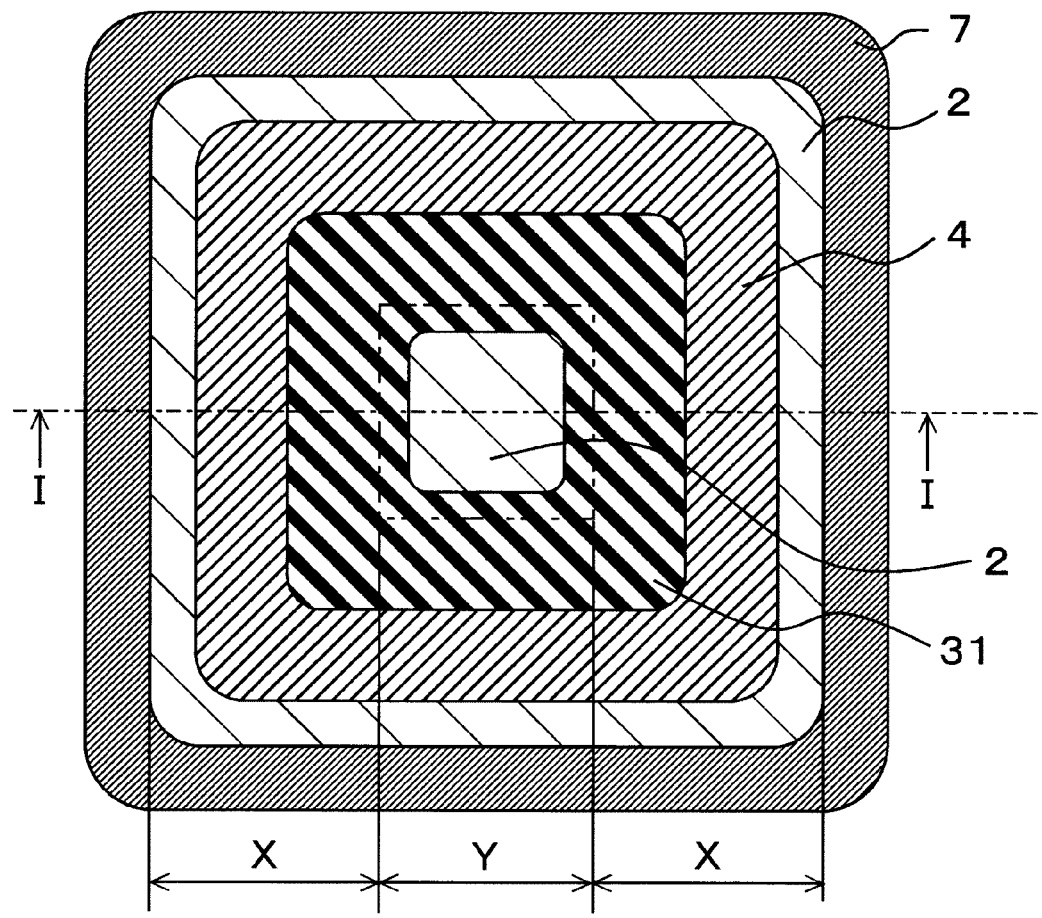
FIG. 24 is a lateral section diagram illustrating a structure of the silicon carbide semiconductor device (Schottky diode) according to Embodiment 2 of the present invention.
Figure 25:
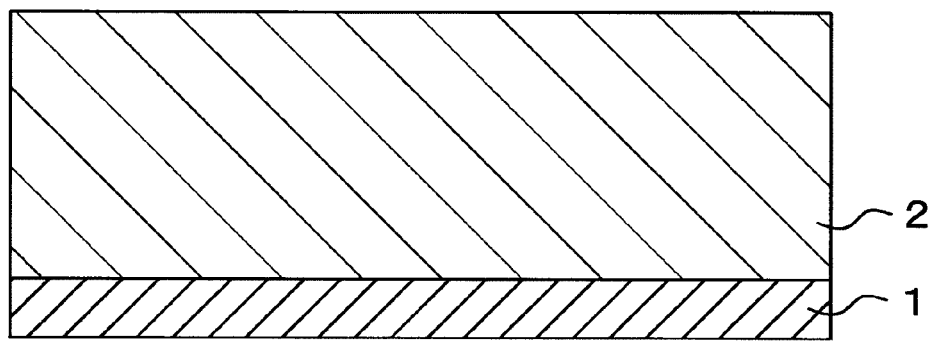
FIG. 25 is an illustrative diagram for explaining a manufacturing process of the silicon carbide semiconductor device (Schottky diode) according to Embodiment 2 of the present invention.
Figure 26:
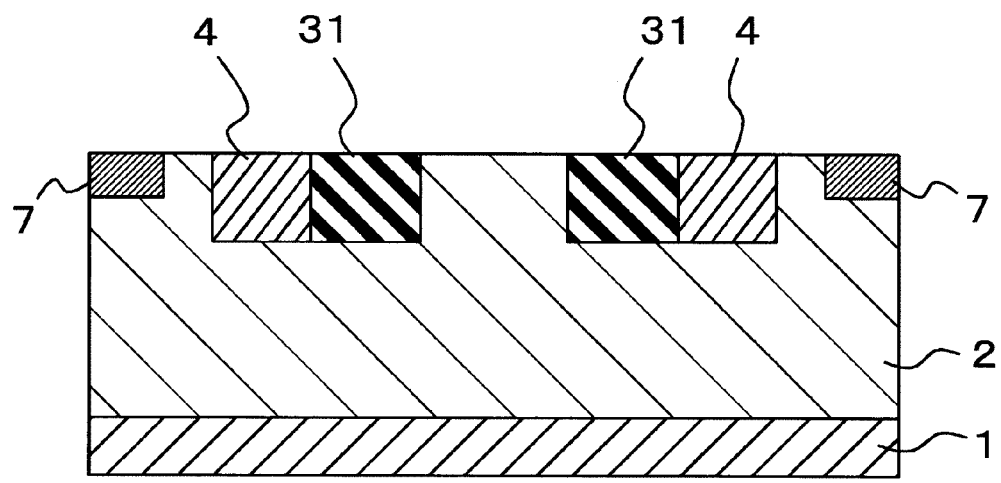
FIG. 26 is an illustrative diagram for explaining a manufacturing process of the silicon carbide semiconductor device (Schottky diode) according to Embodiment 2 of the present invention.
Figure 27:
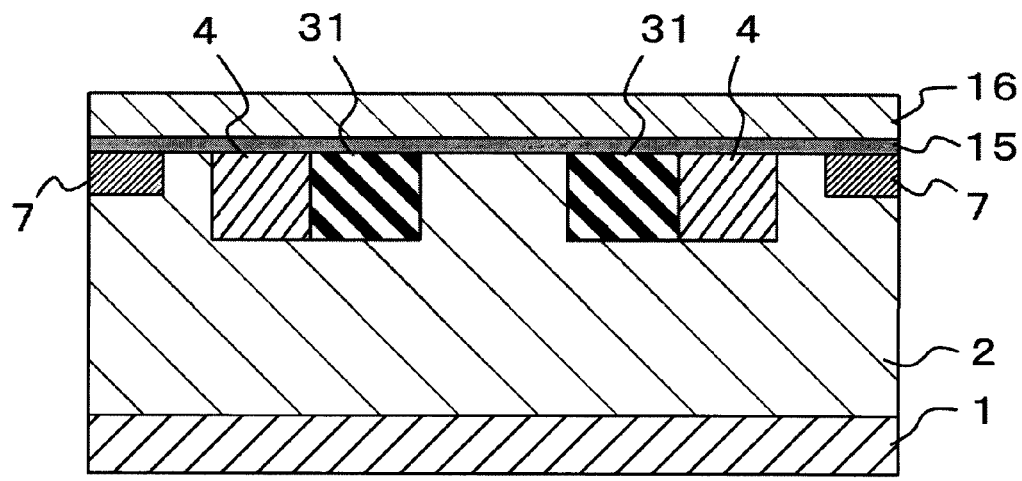
FIG. 27 is an illustrative diagram for explaining a manufacturing process of the silicon carbide semiconductor device (Schottky diode) according to Embodiment 2 of the present invention.
Figure 28:
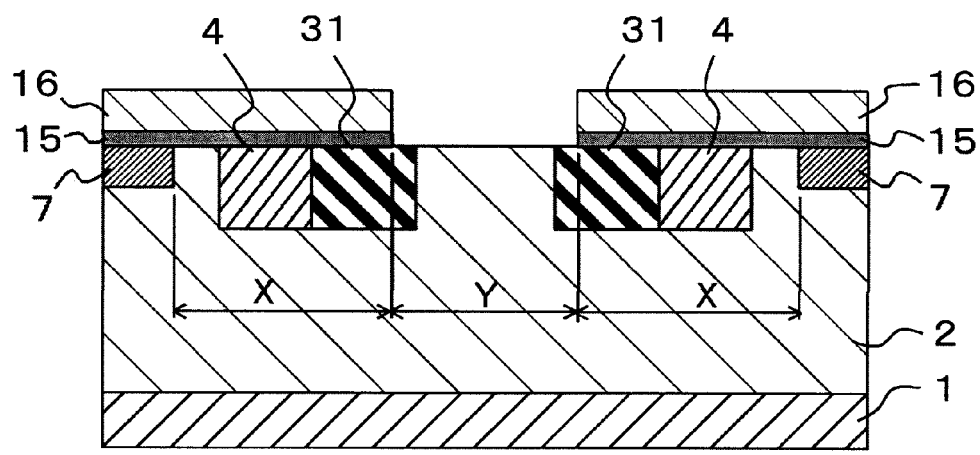
FIG. 28 is an illustrative diagram for explaining a manufacturing process of the silicon carbide semiconductor device (Schottky diode) according to Embodiment 2 of the present invention.
Figure 29:
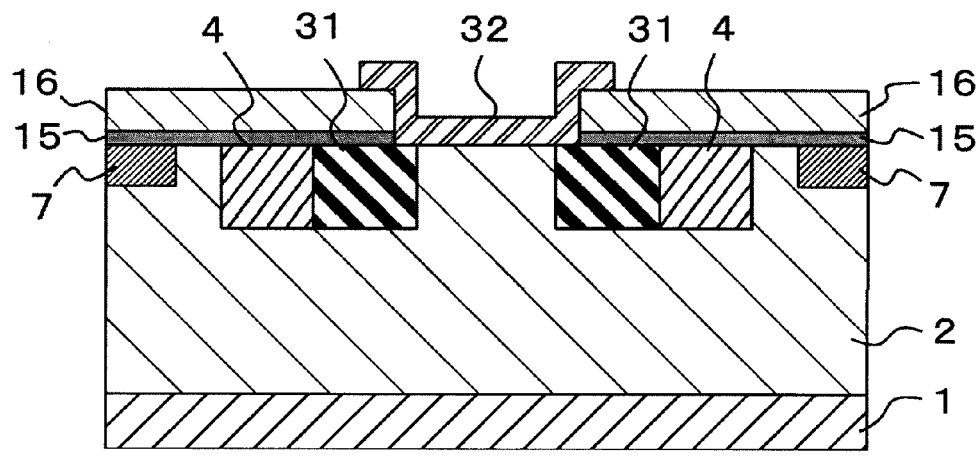
FIG. 29 is an illustrative diagram for explaining a manufacturing process of the silicon carbide semiconductor device (Schottky diode) according to Embodiment 2 of the present invention.
Figure 30:
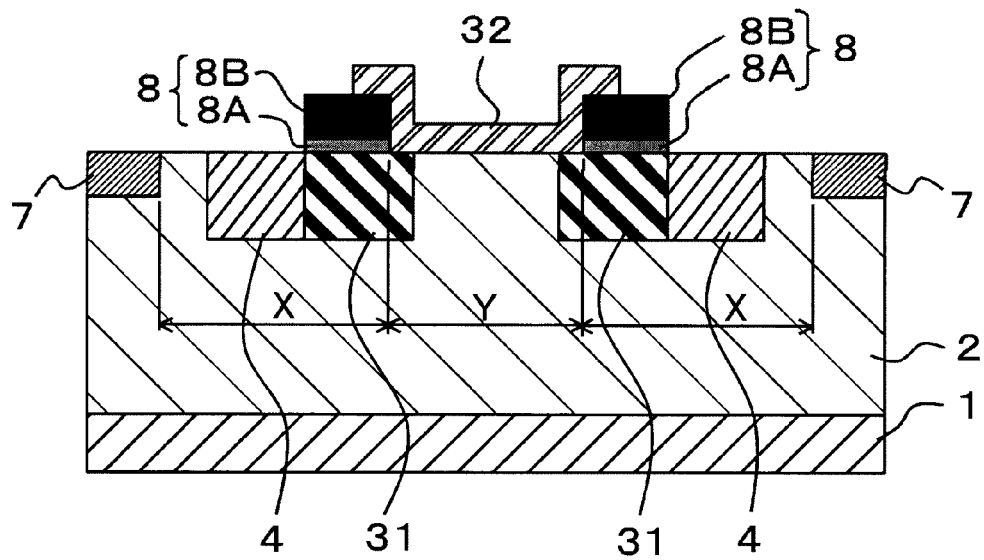
FIG. 30 is an illustrative diagram for explaining a manufacturing process of the silicon carbide semiconductor device (Schottky diode) according to Embodiment 2 of the present invention.
Figure 31:
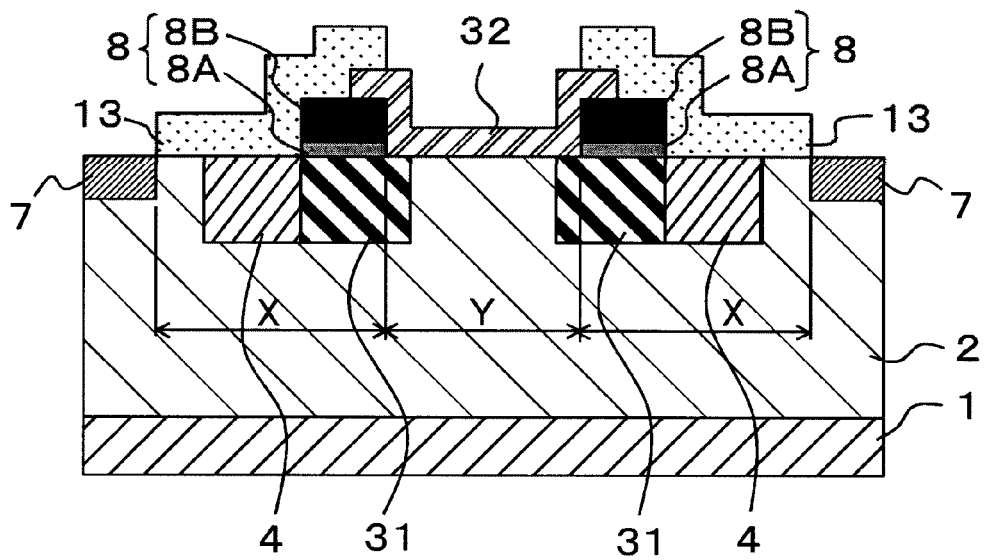
FIG. 31 is an illustrative diagram for explaining a manufacturing process of the silicon carbide semiconductor device (Schottky diode) according to Embodiment 2 of the present invention.

FIG. 23 illustrates a cross-sectional structure viewed from a lateral side of a silicon carbide semiconductor device according to Embodiment 2 of the present invention. In addition, a cross-sectional structure viewed from the top side is illustrated in FIG. 24. Here, the cross-sectional structures are illustrated for a Schottky diode as the silicon carbide semiconductor device. Note that, FIG. 23 shows a cross-section viewed along the arrows I-I of FIG. 24, and FIG. 24 shows a cross-section viewed along the arrows II-II of FIG. 23. Moreover, a method of manufacturing the Schottky diode illustrated in FIG. 23 and FIG. 24 is explanatorily shown in FIG. 25 through FIG. 31. Also in FIG. 23 through FIG. 31, the same reference numerals and symbols designate the same items as, or the items corresponding to, those shown in FIG. 1 through FIG. 12 showing the cross-sectional structures and the method of manufacturing the power MOSFET in Embodiment 1.

First, the structure of the Schottky diode will be explained referring to FIG. 23 and FIG. 24.

Numeral "1" designates an $n^+$-type (first conductivity type) semiconductor substrate. Numeral "2" designates an $n^-$-type (first conductivity type) silicon carbide layer (drift layer). Numeral "4" designates a $p^-$-type (second conductivity type) electric-field relaxation region. This electric-field relaxation region comprises an electric-field relaxation structure such as a JTE or MFGR structure. Numeral "7" designates an $n^+$-type (first conductivity type) channel stopper region as a second region. Numeral "8" designates an inorganic protection film. This inorganic protection film 8 is in a multilayered structure, constituted of a thermal oxide film 8A and a first insulation film 8B in this order from the top side of the silicon carbide layer 2. Numeral "13" designates an organic protection film. Numeral "31" designates a p-type (second conductivity type) guard-ring region as a first region. Numeral "32" designates a Schottky electrode as a first main electrode. Numeral "33" designates a cathode electrode as a second main electrode.

In addition, in FIG. 23 and FIG. 24, a termination end-portion for electric-field relaxation is in the range shown by "X" in the figures. The range of the termination end-portion X corresponds to each of the ranges from outer lateral end portions of the Schottky electrode 32 (inner lateral end portions of the inorganic protection film 8) to inner lateral end-portions of the channel stopper region 7. Note that, the range Y in the interspace of the termination end-portion X is a cell portion that is driven as a semiconductor element (Schottky diode).

Next, the method of manufacturing the Schottky diode illustrated in FIG. 23 and FIG. 24 will be explained referring to FIG. 25 through FIG. 31.

First, using an epitaxial crystal growth method, an n$^-$-type silicon carbide layer 2 made of silicon carbide is formed on a surface of an n$^+$-type semiconductor substrate 1. As for the semiconductor substrate 1, an n$^+$-type silicon carbide substrate is suitable in use, for example. A silicon carbide wafer is constituted by the semiconductor substrate 1 and the silicon carbide layer 2. (Refer to FIG. 25.)

Next, in a predetermined region in the top side of the silicon carbide layer 2, an annular guard-ring region 31 of a p-type is selectively formed as a first region by applying a resist as a mask and ion-implanting an impurity. (Refer to FIG. 26.)

Next, by applying a resist as a mask and ion-implanting an impurity, an electric-field relaxation region 4 is formed surrounding the guard-ring region 31. (Refer to FIG. 26.)

As for the electric-field relaxation region 4, there is an electric-field relaxation structure such as a JTE or a MFGR, for example. Here, the JTE is formed with a p$^-$-type region having its impurity concentration relatively lower than the impurity concentration of the guard-ring region 31. In addition, the MFGR is formed such that a plurality of regions of the silicon carbide layer 2 and regions of a p-type are alternately placed on the outer lateral side of the guard-ring region 31 to constitute a p$^-$-type region whose average impurity concentration is relatively lower than the impurity concentration of the guard-ring region 31. It should be noted that, other than the JTE or the MFGR, there is also a structure called an FLR (field limiting ring), for example; however, its structure is comparable to that of the MFGR. Here, a region in which such an electric-field relaxation structure is formed is referred to as an electric-field relaxation region 4.

Next, in the top side of the silicon carbide layer 2 and in an outer perimeter of an electric-field relaxation region 4, the n$^+$-type channel stopper region 7 is formed as a second region in a zone spaced apart, by an exposed region of the silicon carbide layer 2, from the electric-field relaxation region 4, by applying a resist as a mask and ion-implanting an impurity. Note that, a dicing region may be formed as the second region in place of the channel stopper region 7 when it is not formed. (Refer to FIG. 26.)

Note that, specific examples for ion-implantation include phosphorous (P) and nitrogen (N) as the impurities that become an n-type. In addition, specific examples include boron (B) and aluminum (Al) as the impurities that become a p-type.

Next, heat treatment is performed for the silicon carbide wafer at high temperatures (for example, at 1500° C. for 30 minutes in argon (Ar) ambient). Because of this, implanted ions are electrically activated, and crystal defects formed by the ion implantation recover.

Next, an oxide film 15 made of silicon dioxide (SiO$_2$) is formed on a top-side surface of the silicon carbide wafer, using a thermal oxidation method. The oxide film formed here is a thermal oxide film. (Refer to FIG. 27.)

Next, an insulation film 16 made of silicon dioxide (SiO$_2$) is formed on the top-side surface of the thermal oxide film 15, using a chemical vapor deposition method such as CVD utilizing a TEOS gas. The insulation film 16 formed here is a TEOS oxide film. Note that, as for the insulation film 16, it is possible to use, other than the TEOS oxide film, an oxide film formed another method than the thermal oxidation, such as a BPSG film. (Refer to FIG. 27.)

Next, by applying a resist as a mask and using a method of wet etching or plasma-using etching, portions of the oxide film 15 and the insulation film 16 are removed other than those on the area of the termination end-portion X and the channel stopper region 7. Because of this, portions of the guard-ring region 31 and the silicon carbide layer 2 are exposed in the cell portion Y. (Refer to FIG. 28.)

Next, a Schottky electrode 32 is formed on the exposed top-side surfaces of the guard-ring region 31 and silicon carbide layer 2 by applying a resist as a mask and using a physical vapor deposition method such as sputtering. Here, the Schottky electrode 32 is formed so as to cover parts of the insulation film 16. (Refer to FIG. 29.)

Next, by applying a resist as a mask and using a method of wet etching or plasma-using etching, portions of the oxide film 15 and the insulation film 16 are removed that are on the surface of the termination end-portion X excluding those on the guard-ring region 31, and that are on the surface of the channel stopper region 7. Because of this, the electric-field relaxation region 4 and the silicon carbide layer 2 are exposed in the area of the termination end-portion X. At the same time, the channel stopper region 7 is also exposed. In addition, an inorganic protection film 8 constituted of a thermal oxide film 8A and a first insulation film 8B shown in FIG. 23 is accordingly formed. (Refer to FIG. 30.)

Next, using a method such as coating, an organic protection film 13 is formed so as to cover the termination end-portion X. Specifically, in the termination end-portion X, an organic protection film 13 is formed on the exposed surfaces of the electric-field relaxation region 4 and the silicon carbide layer 2, and on the surfaces of the inorganic protection film 8 and parts of the Schottky electrode 32. As for the organic protection film 13, a film can be used if it has a high electrical insulation capability with a little influence by electric charges. For example, a polyimide film or a silicone film is suitable in use. (Refer to FIG. 31.)

Lastly, using a physical vapor deposition method such as sputtering, a cathode electrode 33 is formed on the bottom face of a semiconductor substrate 1. Specific examples for a material that becomes the cathode electrode 33 include aluminum (Al) and nickel (Ni).

According to the manner described above, the main part of a Schottky diode illustrated in FIG. 23 and FIG. 24, which is a silicon carbide semiconductor device, is completed.

Also applicable to the explanation hereinafter, is the evaluation result of the effective fixed electric-charge densities for the respective samples A through D described in the example of Embodiment 1.

As also described in Embodiment 1, the withstand voltage of a silicon carbide semiconductor device is usually required to be 1.2 kV or higher on a design basis. In order to satisfy the requirement, acceptor surface-density of the guard-ring region 31 is to be approximately $5.0 \times 10^{13}$ cm$^{-2}$; acceptor surface-density of an electric-field relaxation region 4, approximately $2.0 \times 10^{13}$ cm$^{-2}$; and donor surface-density of the silicon carbide layer 2 that is a drift layer, approximately $5.0 \times 10^{12}$ cm$^{-2}$.

Here, acceptor surface-density of the guard-ring region 31 and the electric-field relaxation region 4, and a donor surface-density of the silicon carbide layer 2, that are required on the withstand-voltage design basis, are compared with an acceptor surface-density of the p-type silicon carbide layer 23 and a donor surface-density of the n-type silicon carbide layer 21, that are determined as necessary to exert influence on the withstand voltage by evaluating the test samples A through D.

First, when consideration is given to the guard-ring region 31, its acceptor surface-density required on the design basis is approximately $5.0\times10^{13}$ cm$^{-2}$, and from the evaluation result of the test samples, its acceptor surface-density that exerts influence on the withstand voltage is lower than or equal to $2.5\times10^{13}$ cm$^{-2}$. The value of approximately $5.0\times10^{13}$ cm$^{-2}$ that is the acceptor surface-density required on the design basis, is higher than the value of $2.5\times10^{13}$ cm$^{-2}$ that is the acceptor surface-density which exerts influence on the withstand voltage. Consequently, it can be said that an influence by the inorganic protection film 8 can be disregarded. Therefore, it is not necessary to remove the inorganic protection film 8.

Next, when consideration is given to the electric-field relaxation region 4, its acceptor surface-density required on the design basis is approximately $2.0\times10^{13}$ cm$^{-2}$, and from the evaluation result of the test samples, its acceptor surface-density that exerts influence on the withstand voltage is lower than or equal to $2.5\times10^{13}$ cm$^{-2}$. The value of approximately $2.0\times10^{13}$ cm$^{-2}$ that is the acceptor surface-density required on the design basis, is not higher than or almost equal to, the value of $2.5\times10^{13}$ cm$^{-2}$ that is the acceptor surface-density which exerts influence on the withstand voltage. Consequently, it can be said that an influence by the inorganic protection film 8 cannot be disregarded. Therefore, it is necessary to remove the inorganic protection film 8.

Lastly, when consideration is given to the silicon carbide layer 2, its donor surface-density required on the design basis is approximately $5.0\times10^{12}$ cm$^{-2}$, and from the evaluation result of the test samples, its donor surface-density that exerts influence on the withstand voltage is lower than or equal to $5.0\times10^{12}$ cm$^{-2}$. The value of approximately $5.0\times10^{12}$ cm$^{-2}$ that is the acceptor surface-density required on the design basis, is comparable to the value of $5.0\times10^{12}$ cm$^{-2}$ that is the acceptor surface-density which exerts influence on the withstand voltage, but is lower than the value of $1.0\times10^{13}$ cm$^{-2}$ that is described in Embodiment 1 as including a margin to the value of $5.0\times10^{12}$ cm$^{-2}$ that is the acceptor surface-density which exerts influence on the withstand voltage. Consequently, it can be said that an influence by the inorganic protection film 8 cannot be disregarded. Therefore, it is necessary to remove the inorganic protection film 8.

According to the foregoing, it is preferable that, in the termination end-portion X, an inorganic protection film 8 on a top-side surface of the guard-ring region 31 be kept remaining, and an inorganic protection film 8 on top-side surfaces of the electric-field relaxation region 4 and the silicon carbide layer 2 be removed. Note that, in order to give protection against the influence by foreign substance or moisture, the exposed electric-field relaxation region 4 and silicon carbide layer 2 from which parts of the inorganic protection film 8 have been removed, are protected by an organic protection film 13 having a high electrical insulation capability with a little influence by electric charges such as a polyimide film or a silicone film.

Accordingly, the withstand voltage of the Schottky diode that is the silicon carbide semiconductor device is stabilized. In addition, the inorganic protection film 8 having high heat resistance is formed in the termination end-portion X on its side nearer to the cell portion Y, and the organic protection film 13 is provide apart from the cell portion Y, so that it is possible to prevent the organic protection film 13 from degrading due to heat generation during the energization or when a surge current flows. For this reason, it is possible to also secure reliability in high-temperature operations.

In the silicon carbide semiconductor device according to Embodiment 2 of the present invention, the termination end-portion X provided for relaxing the electric field is provided with the inorganic protection film 8 that is formed on the exposed surface portion of the guard-ring region 31, and the organic protection film 13 that is formed on the exposed surface of the electric-field relaxation region 4 and on the exposed surface portion of the silicon carbide layer 2, so that a silicon carbide semiconductor device can be attained that ensures both stability of withstand voltage and reliability in high-temperature operations in the termination end-portion X.

Figure 32:
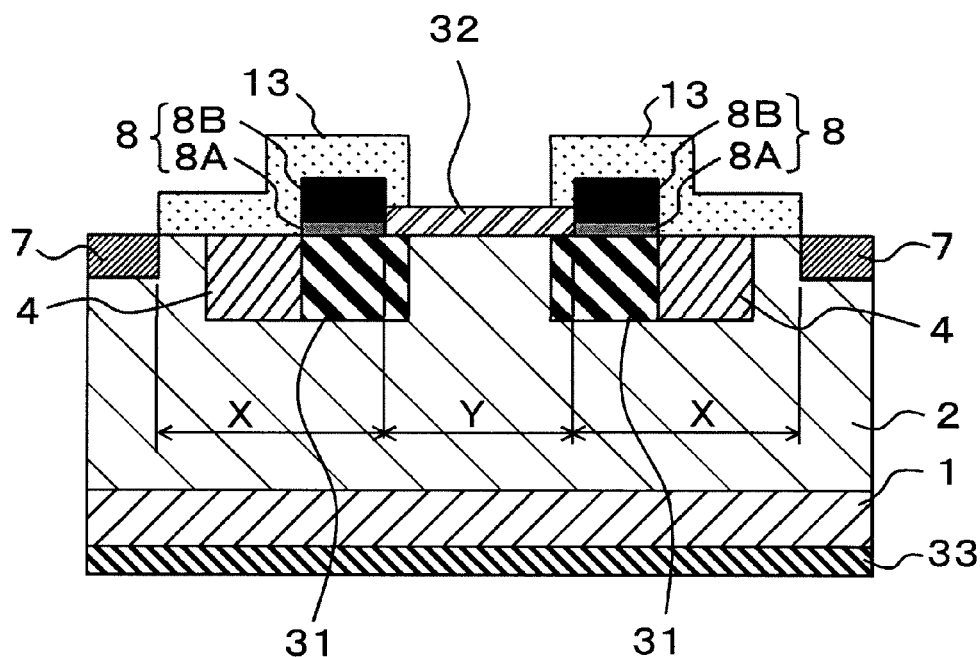
FIG. 32 is a longitudinal section diagram illustrating another structure of a silicon carbide semiconductor device (Schottky diode) according to Embodiment 2 of the present invention.

Note that, in FIG. 23, the Schottky electrode 32 is shown whose end portions are formed so as to cover parts on top-side surfaces of the inorganic protection film 8; however, as shown in FIG. 32, it is not necessary that end portions of a Schottky electrode 32 be formed to cover parts on the top-side surfaces of the inorganic protection film 8. More particularly, the Schottky electrode 32 may be formed only on top-side surface portions of the silicon carbide layer 2 and the guard-ring region 31 corresponding to the cell portion Y.

Figure 33:
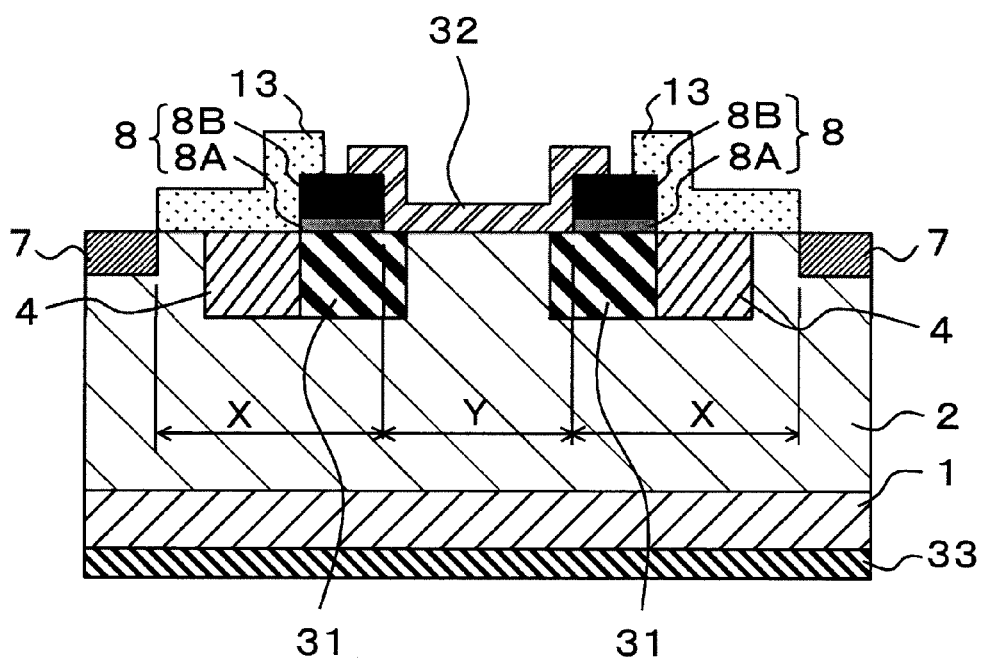
FIG. 33 is a longitudinal section diagram illustrating another structure of a silicon carbide semiconductor device (Schottky diode) according to Embodiment 2 of the present invention.

In addition, in FIG. 23, the organic protection film 13 is in contact with the Schottky electrode 32; however, it is possible that the organic protection film 13 be not in contact with the Schottky electrode 32 as shown in FIG. 33. In this case, it is possible to prevent heat that is generated during the energization or when a surge current flows, from transferring to the organic protection film 13 by way or the Schottky electrode 32. For this reason, it becomes possible to further prevent thermal degradation of the organic protection film 13. Note that, in FIG. 33, the organic protection film 13 covers the parts of the inorganic protection film 8; however, it is simply required that the organic protection film cover at least surface portions of the electric-field relaxation region 4 and the silicon carbide layer 2 that are the exposed portions in the termination end-portion X.

Figure 34:
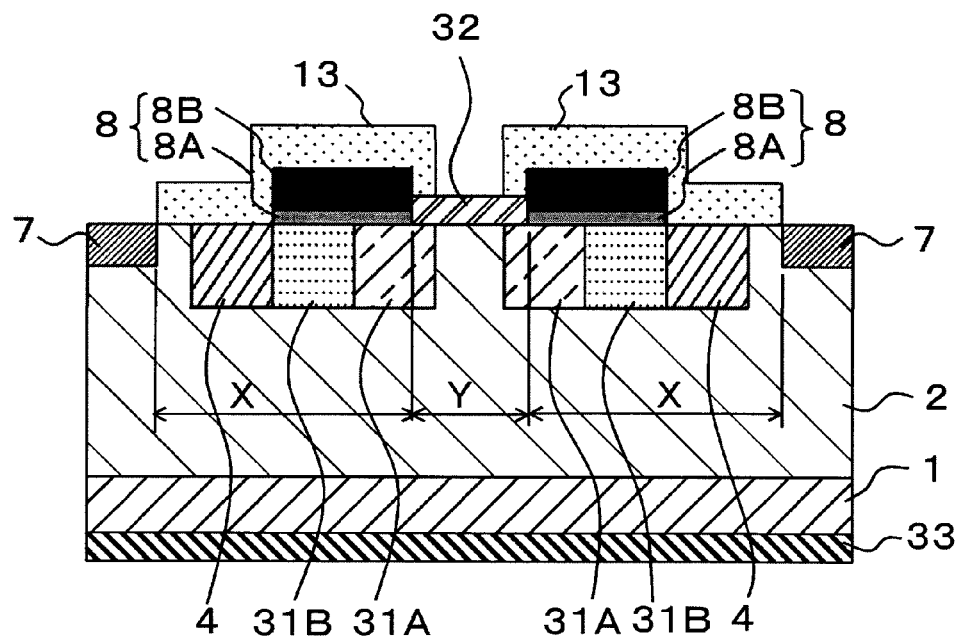
FIG. 34 is a longitudinal section diagram illustrating another structure of a silicon carbide semiconductor device (Schottky diode) according to Embodiment 2 of the present invention.

In addition, while FIG. 23 shows the termination end-portion X that comprises the guard-ring region 31, the electric-field relaxation region 4 and the silicon carbide layer 2 formed in this order from its side nearer to the cell portion Y toward the channel stopper region 7, it is possible to enhance the reliability in high-temperature operations by dividing the guard-ring region 31 into a first guard-ring region 31A and a second guard-ring region 31B in this order from the side nearer to the cell portion Y, and by making the impurity concentration of the first guard-ring region 31A higher, as shown in FIG. 34. For example, the withstand voltage of the Schottky diode is stabilized at 1.2 kV or higher by the setting acceptor surface-density of the guard-ring region 31A to $7.0\times10^{13}$ cm$^{-2}$, the acceptor surface-density of the guard-ring region 31B to $5.0\times10^{13}$ cm$^{-2}$ that is the same as that of the guard-ring region 31, the acceptor surface-density of the electric-field relaxation region 4 to $2.0\times10^{13}$ cm$^{-2}$, and the donor surface-density of the silicon carbide layer 2 to $5.0\times10^{12}$ cm$^{-2}$. Moreover, in this case, in the termination end-portion X, an inorganic protection film 8 is formed on the surfaces of the first guard-ring region 31A and the second guard-ring region 31B, and an organic protection film 13 is formed on the surface of an electric-field relaxation region 4 and on the surface portion of the silicon carbide layer 2.

Figure 35:
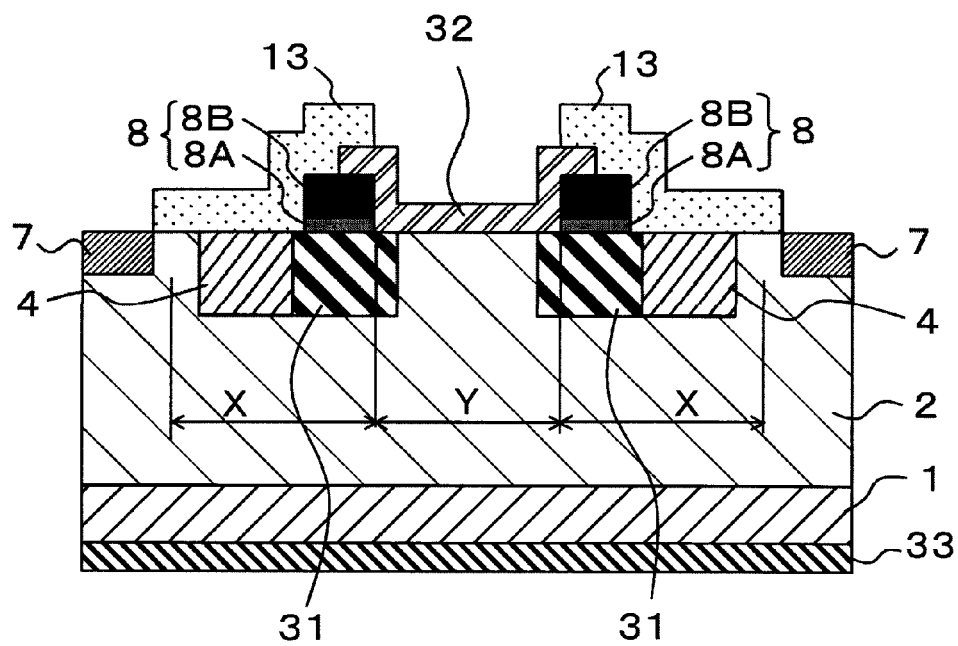
FIG. 35 is a longitudinal section diagram illustrating another structure of a silicon carbide semiconductor device (Schottky diode) according to Embodiment 2 of the present invention.

Moreover, illustrated in FIG. 23 is provided with the organic protection film 13 formed on the top-side surface of the electric-field relaxation region 4 and on the top-side surface portion of the silicon carbide layer 2; however, the organic protection film 13 can be formed so as to extend onto a top-side surface of an outer edge portion of the guard-ring region 31 as shown in FIG. 35.

As described above, in order to ensure design flexibility for the organic protection film 13, it is important that the organic protection film 13 is allowed to be formed on the top-side surface of an outer edge portion of the guard-ring region 31.

Figure 36:
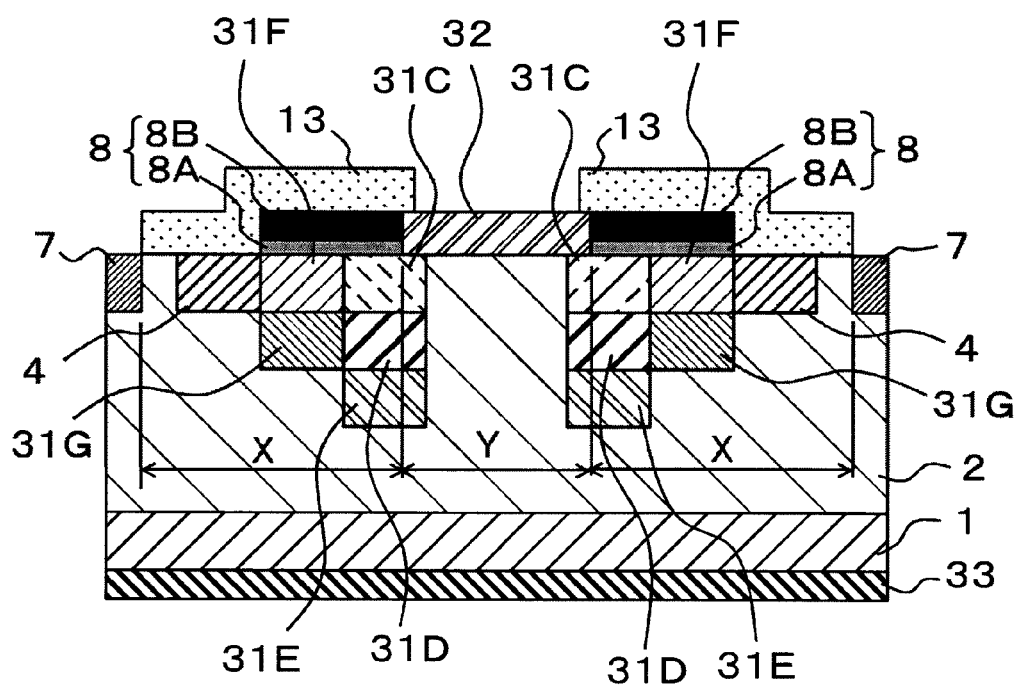
FIG. 36 is a longitudinal section diagram illustrating another structure of a silicon carbide semiconductor device (Schottky diode) according to Embodiment 2 of the present invention.
Figure 37:
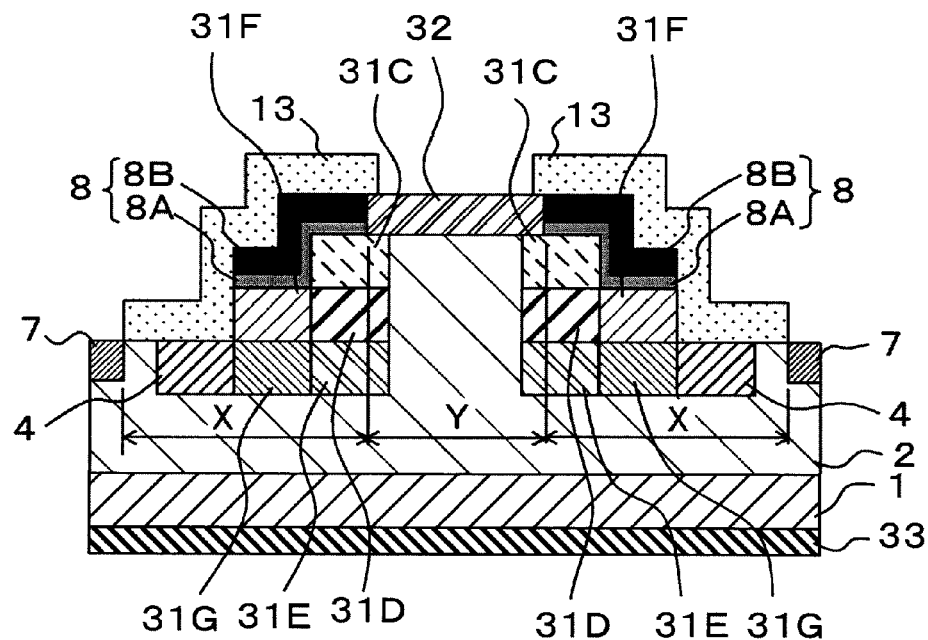
FIG. 37 is a longitudinal section diagram illustrating another structure of a silicon carbide semiconductor device (Schottky diode) according to Embodiment 2 of the present invention.

Note that, as the Schottky diode, there are other structures such as those illustrated in FIG. 36 and FIG. 37. FIG. 36 indicates one in a planar shape, and FIG. 37 indicates another in a stairway shape. In FIG. 36 and FIG. 37, what is different from that in FIG. 23 is that a guard-ring region 31 is made to have a net-like matrix structure.

In FIG. 36 and FIG. 37, the guard-ring region 31 is constituted of guard-ring regions 31C through 31G that differ depending on their impurity concentrations. The guard-ring region 31C is of a p$^+$-type. The guard-ring region 31D is of a p-type, having relatively lower impurity concentration than that of the guard-ring region 31C. The guard-ring region 31E is of a p$^-$-type, having relatively lower impurity concentration than that of the guard-ring region 31D. The guard-ring region 31F is of a p-type, having relatively lower impurity concentration than that of the guard-ring region 31C, and comparable to that of the guard-ring region 31D. The guard-ring region 31G is of a p$^-$-type, having relatively lower impurity concentration than that of the guard-ring region 31F, and comparable to that of the guard-ring region 31E.

The guard-ring regions 31C through 31E are formed from the top-side surface of the silicon carbide layer 2 in the depth direction so as to contact with each other. The guard-ring region 31F is formed to make contact with a perimeter of the guard-ring region 31C in the top side of the silicon carbide layer 2, in the case of the planar shape shown in FIG. 36, and formed to make contact with a perimeter of the guard-ring region 31D in the top side of the silicon carbide layer 2, in the case of the stairway shape shown in FIG. 37. The guard-ring region 31G is formed to make contact with a perimeter of the guard-ring region 31D, in the case of the planar shape shown in FIG. 36, and formed to make contact with a perimeter of the guard-ring region 31E, in the case of the stairway shape shown in FIG. 37. In addition, an electric-field relaxation region 4 is formed surrounding the guard-ring region 31F, in the case of the planar shape shown in FIG. 36, and formed surrounding the guard-ring region 31G, in the case of the stairway shape shown in FIG. 37.

Also in the Schottky diode illustrated in FIG. 36 or FIG. 37, because the impurity concentrations of the guard-ring regions 31C and 31F on the top-side surface of the silicon carbide layer 2 are comparable to those of the guard-ring regions 31A and 31B shown in FIG. 34, respectively, an inorganic protection film 8 is formed on the top-side surfaces of the guard-ring regions 31C and 31F in the termination end-portion X. In addition, an organic protection film 13 is formed on the exposed surface of an electric-field relaxation region 4 and on the exposed surface portion of a silicon carbide layer 2. Accordingly, it is possible to obtain the effects described above in this Embodiment 2.

Figure 38:
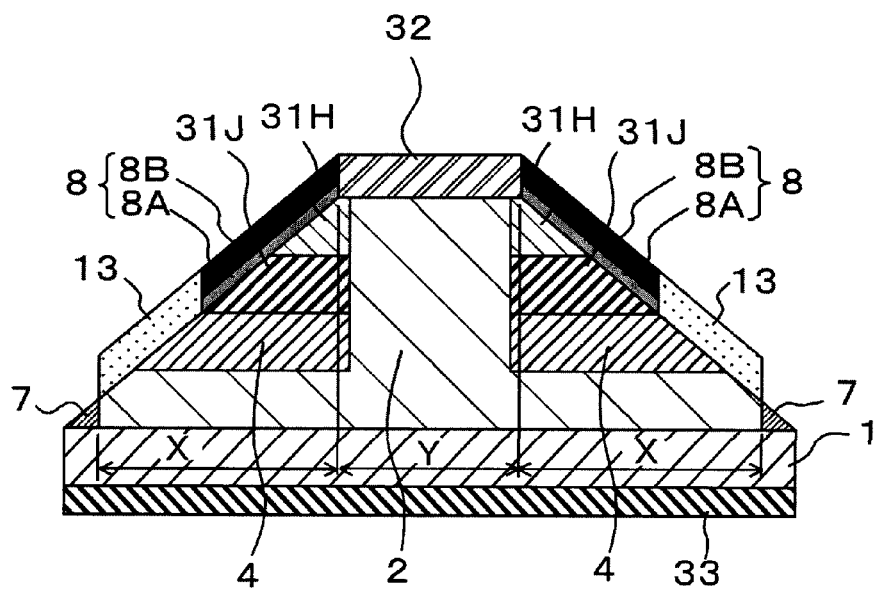
FIG. 38 is a longitudinal section diagram illustrating another structure of a silicon carbide semiconductor device (Schottky diode) according to Embodiment 2 of the present invention.

On the other hand, FIG. 38 shows a Schottky diode of beveled structure. In the Schottky diode of beveled structure, what is different from that in FIG. 23 is that, in the surface of bevel portions of the silicon carbide layer 2 that are tilting portions, guard-ring regions 31H and 31J, and an electric-field relaxation region 4 are formed in this order from the side nearer to a Schottky electrode 32 toward the channel stopper region 7.

Also in the Schottky diode shown in FIG. 38, the impurity concentrations of the guard-ring regions 31H and 31J are comparable to those of the guard-ring regions 31A and 31B shown in FIG. 34, respectively, and therefore, an inorganic protection film 8 is each formed on the surfaces of the guard-ring regions 31H and 31J in the termination end-portion X. In addition, an organic protection film 13 is formed on the exposed surfaces of the electric-field relaxation region 4 and the silicon carbide layer 2. Accordingly, it is possible to obtain the effects described above in this Embodiment 2.

Note that, in FIG. 32 through FIG. 38, the same reference numerals and symbols designate the same items as, or the items corresponding to, those shown in FIG. 23 and FIG. 24.

Embodiment 3

Figure 39:
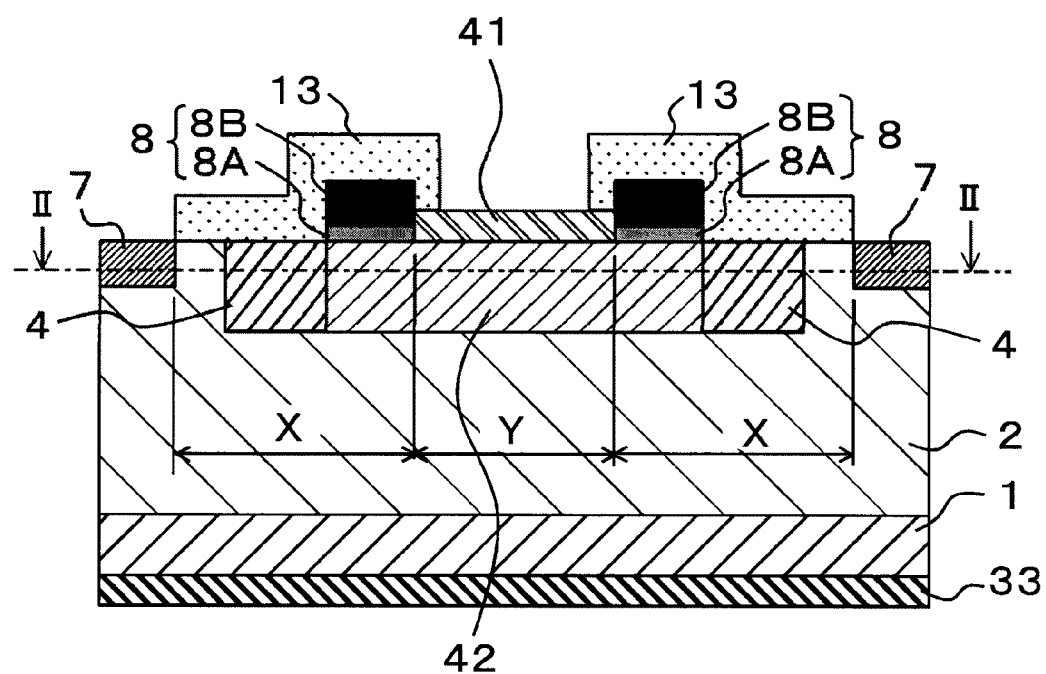
FIG. 39 is a longitudinal section diagram illustrating a structure of a silicon carbide semiconductor device (pn diode) according to Embodiment 3 of the present invention.
Figure 40:
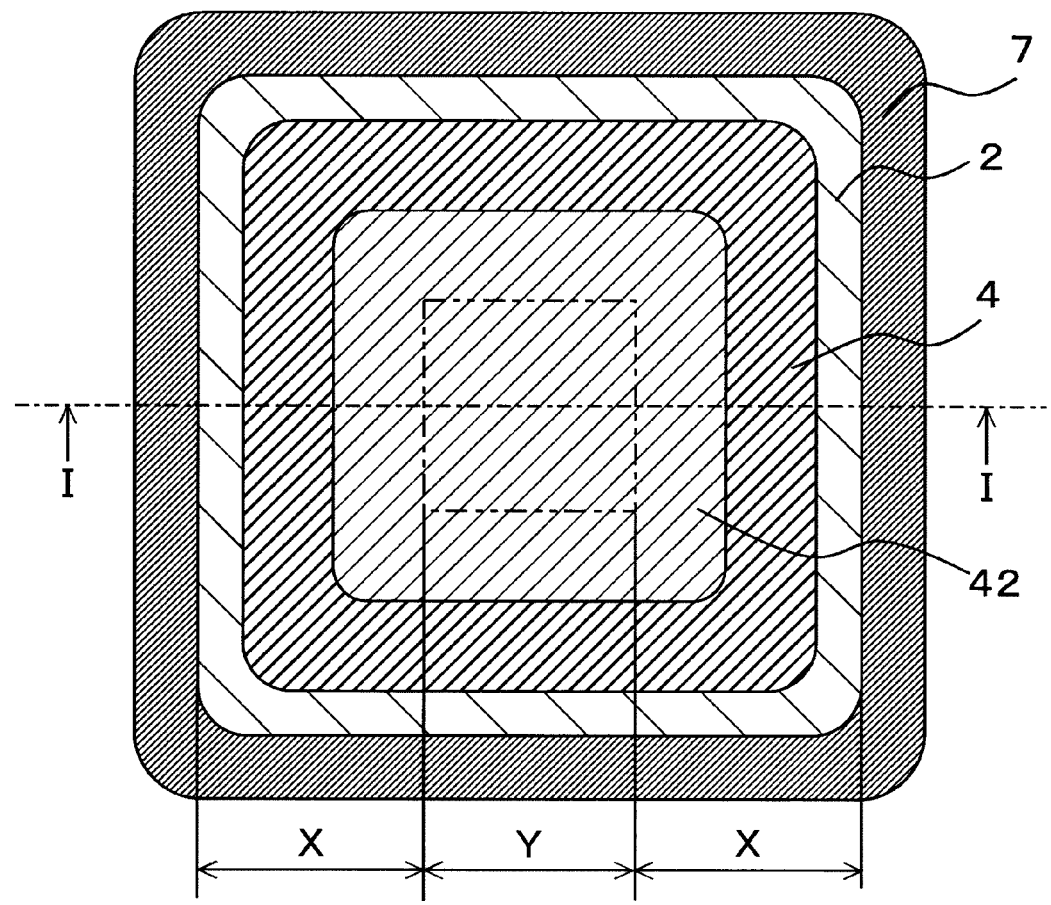
FIG. 40 is a lateral section diagram illustrating a structure of the silicon carbide semiconductor device (pn diode) according to Embodiment 3 of the present invention.

In Embodiment 2, examples of the Schottky diode are described as the silicon carbide semiconductor device having the termination end-portion X for electric-field relaxation. Here, examples of a pn diode will be described. FIG. 39 illustrates a cross-sectional structure viewed from a lateral side of a pn diode that is a silicon carbide semiconductor device in Embodiment 3 of the present invention, and FIG. 40 illustrates a cross-sectional structure viewed from the top side thereof. Note that, FIG. 39 shows a cross-section viewed along the arrows I-I of FIG. 40, and FIG. 40 shows a cross-section viewed along the arrows II-II of FIG. 39. Also in FIG. 39 and FIG. 40, the same reference numerals and symbols designate the same items as, or the items corresponding to, those shown in FIG. 1 and FIG. 2 described in Embodiment 1, and FIG. 23 and FIG. 24 described in Embodiment 2.

Here, in FIG. 39 and FIG. 40, a termination end-portion for electric-field relaxation is in the range shown by "X" in the figures. The range of the termination end-portion X corresponds to each of the ranges from outer lateral end portions of an anode electrode 41 (inner lateral end portions of the inorganic protection film 8) to inner lateral end portions of the channel stopper region 7. Note that, the range Y in the interspace of the termination end-portion X is a cell portion that is driven as a semiconductor element (pn diode).

In the pn diode illustrated in FIG. 39 and FIG. 40, what is different from the Schottky diode illustrated in FIG. 23 and FIG. 24 are that, in place of the Schottky electrode 32, the anode electrode 41 is formed as a first main electrode, and that, in place of the guard-ring region 31, a p-type (second conductivity type) well region 42 is formed as a first region. The well region 42 is formed in the surface of the silicon carbide layer 2 over all interspace zone of the electric-field relaxation region 4 including the cell portion Y. In addition, what is different from the method of manufacturing the Schottky diode illustrated in FIG. 25 through FIG. 31, is that the p-type well region 42 is formed in the portion of the silicon carbide layer 2 on which the anode electrode 41 and the inorganic protection film 8 are to be formed, by applying a resist as a mask and ion-implanting an impurity.

Also in the pn diode that is a silicon carbide semiconductor device according to Embodiment 3 of the present invention, it is possible to ensure both stability of withstand voltage and reliability in high-temperature operations in the termination end-portion X, similarly to Embodiments 1 and 2, by providing the inorganic protection film 8 on the exposed surface portion of the well region 42, and by providing the organic protection film 13 on the exposed surfaces of the electric-field relaxation region 4 and the silicon carbide layer 2.

Figure 41:
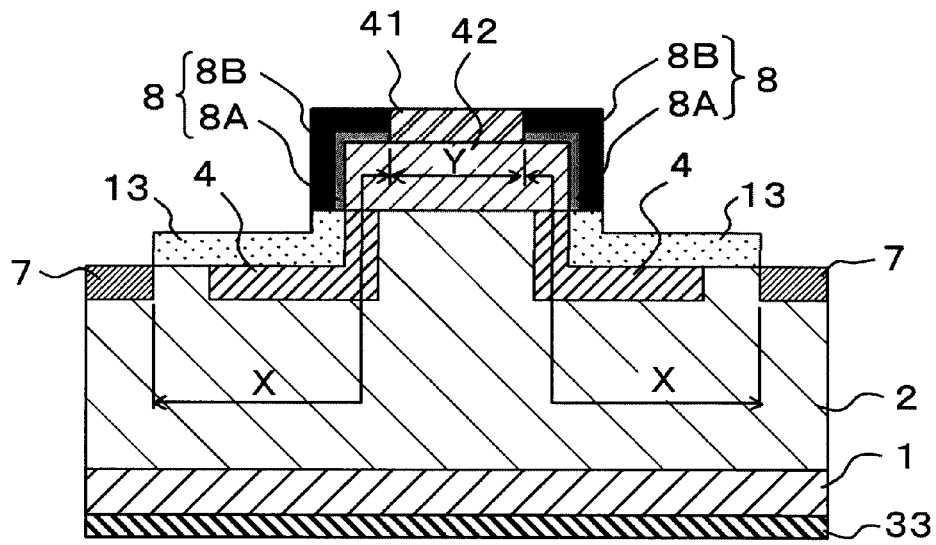
FIG. 41 is a longitudinal section diagram illustrating another structure of a silicon carbide semiconductor device (pn diode) according to Embodiment 3 of the present invention.

In addition, such a structure of the pn diode illustrated in FIG. 39 is also applicable to a mesa-type pn diode illustrated in FIG. 41. In FIG. 41, the same reference numerals and symbols designate the same items as, or the items corresponding to, those shown in FIG. 39.

In the termination end-portion X of the mesa-type pn diode shown in FIG. 41, an inorganic protection film 8 is formed on a surface portion of a well region 42, and an organic protection film 13 is formed on exposed surfaces of the electric-field relaxation region 4 and the silicon carbide layer 2.

Figure 42:
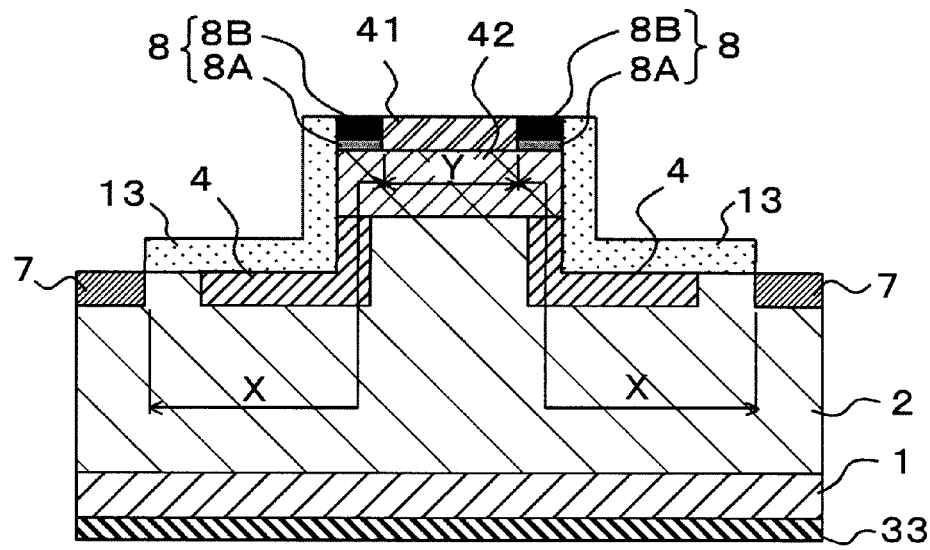
FIG. 42 is a longitudinal section diagram illustrating another structure of a silicon carbide semiconductor device (pn diode) according to Embodiment 3 of the present invention.

Note that, as shown in FIG. 42, it may be adopted that outer lateral ends of an inorganic protection film 8 are aligned with outer lateral planes of the well region 42, and an organic protection film 13 is formed to extend toward the well region 42 so as to cover the outer lateral surfaces of the well region 42 and the inorganic protection film 8. This is because the organic protection film 13 may provide a little influence by electric charges. In addition, when the organic protection film 13 is to be formed on the outer lateral surfaces of the well region 42 and the inorganic protection film 8, it becomes easy to form the organic protection film 13, resulting in an effect of simplifying the manufacturing process.

Note that, Embodiments 1 through 3 illustrate that an inorganic protection film 8 having been formed on the top-side surface of the channel stopper region 7 is removed; however, in the present invention, it is not particularly necessary to remove the film, and it may instead be kept remaining.

In addition, the manufacturing methods described in Embodiments 1 through 3 are strictly given as examples only, and it is needless to say that there are, as a matter of course, other methods so far as they are able to manufacture a silicon carbide semiconductor device according to the present invention can be manufactured.

Moreover, in Embodiments 1 through 3, the explanation is made for the power MOSFET, the Schottky diode and the pn diode each as an example of the silicon carbide semiconductor device; however, applicable devices are any silicon carbide semiconductor devices that include the termination end-portion X for electric-field relaxation such as those described in Embodiment 1 through 3, for example, a JFET (junction field-effect transistor), an IGBT (insulated-gate bipolar transistor), a GTO (gate turn-off thyristor) or a thyristor is expected as an applicable silicon carbide semiconductor device. In addition, the present invention is applicable to a silicon carbide semiconductor device having a trench-type element structure.

Industrial Applicability

A silicon carbide semiconductor device according to the present invention can be applied to a power semiconductor device for mainly controlling high power.

What is claimed is:

1. A silicon carbide semiconductor device comprising a termination end-portion provided for relaxing electric field in a perimeter of a cell portion driven as a semiconductor element, wherein
the termination end-portion comprises,
a first region of a second conductivity type formed extending from a side of the cell portion, placed in a top side of a silicon carbide layer of a first conductivity type, and exposed on a surface of the silicon carbide layer;
an electric-field relaxation region of the second conductivity type whose impurity concentration is relatively lower than that of the first region; and
the silicon carbide layer; and wherein
an inorganic protection film is formed directly on a surface of an exposed portion of the first region; and
an organic protection film is formed at least on a surface of the electric-field relaxation region and on a surface portion of the silicon carbide layer.

2. The silicon carbide semiconductor device as set forth in claim 1, wherein the electric-field relaxation region is formed with regions of the second conductivity type together with regions of the first conductivity type in alternate relation, and their average impurity concentration of the second conductivity type in the electric-field relaxation region is made relatively lower than that of the first region.

3. The silicon carbide semiconductor device as set forth in claim 1, wherein the organic protection film extends onto the surface of the first region.

4. The silicon carbide semiconductor device as set forth in claim 1, wherein the first region includes, on its cell portion side, a region of the second conductivity type having a relatively higher impurity concentration.

5. The silicon carbide semiconductor device as set forth in claim 1, wherein
the inorganic protection film is made of a thermal oxide film and an oxide film other than the thermal oxide film, the oxide film being formed after the thermal oxide film is formed on the surface of the first region, and
the organic protection film is made of a polyimide film or a silicone film.

6. The silicon carbide semiconductor device as set forth in claim 1, wherein surface impurity density of acceptor included in the first region is higher than $2.5 \times 10^{13}$ cm$^{-2}$; surface impurity density of acceptor included in the electric-field relaxation region is not higher than, or approximately the same as, $2.5 \times 10^{13}$ cm$^{-2}$; and surface impurity density of donor included in the silicon carbide layer is not higher than, or approximately the same as, $1.0 \times 10^{13}$ cm$^{-2}$.

7. The silicon carbide semiconductor device as set forth in claim 1, wherein surface density of acceptor in the first region is higher than five times the effective electric-charge density in the inorganic protection film;
surface density of acceptor in the electric-field relaxation region is not higher than, or approximately the same as, five times the effective electric-charge density in the inorganic protection film; and
surface density of donor in the silicon carbide layer is not higher than, or approximately the same as, ten times the effective electric-charge density in the inorganic protection film.

8. The silicon carbide semiconductor device as set forth in claim 1, wherein the cell portion comprises the semiconductor element that is one selected from a MOSFET, a Schottky diode, a pn diode, a JFET, an IGBT, a GTO, and a thyristor.

* * * * *